United States Patent
Matsukura

(10) Patent No.: US 8,912,547 B2
(45) Date of Patent: Dec. 16, 2014

(54) LIGHT-EMITTING DEVICE, DISPLAY DEVICE, AND SEMICONDUCTOR DEVICE

(71) Applicant: Semiconductor Energy Laboratory Co., Ltd., Kanagawa-ken (JP)

(72) Inventor: Hideki Matsukura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 64 days.

(21) Appl. No.: 13/739,593

(22) Filed: Jan. 11, 2013

(65) Prior Publication Data

US 2013/0187187 A1     Jul. 25, 2013

(30) Foreign Application Priority Data

Jan. 20, 2012   (JP) .................... 2012-01055

(51) Int. Cl.
- H01L 27/14 (2006.01)
- H01L 29/04 (2006.01)
- H01L 29/15 (2006.01)
- H01L 31/036 (2006.01)
- H01L 27/12 (2006.01)
- H01L 27/24 (2006.01)
- H01L 27/32 (2006.01)
- H01L 33/62 (2010.01)
- H01L 29/786 (2006.01)

(52) U.S. Cl.
CPC .......... *H01L 27/2436* (2013.01); *H01L 27/124* (2013.01); *H01L 29/7869* (2013.01); *H01L 2924/0002* (2013.01); *H01L 27/3276* (2013.01); *H01L 33/62* (2013.01)
USPC ................. 257/72; 428/26; 313/504; 349/46; 349/47

(58) Field of Classification Search
USPC ........ 257/59, 72; 313/504, 169.3; 349/46, 47, 349/69, 147, 187; 438/26
See application file for complete search history.

(56) References Cited

U.S. PATENT DOCUMENTS

| 6,576,926 | B1 | 6/2003 | Yamazaki et al. |
| 6,774,574 | B1 | 8/2004 | Koyama |
| 7,728,510 | B2 * | 6/2010 | Oh ............................. 313/504 |
| 8,536,580 | B2 * | 9/2013 | Kang ............................. 257/72 |

(Continued)

FOREIGN PATENT DOCUMENTS

| JP | 2003-257657 | 9/2003 |
| JP | 2005-228805 | 8/2005 |
| JP | 2006-108169 | 4/2006 |

*Primary Examiner* — Sonya D McCall Shepard
(74) *Attorney, Agent, or Firm* — Husch Blackwell LLP

(57) ABSTRACT

A light-emitting device which includes a semiconductor layer; a first insulating layer over the semiconductor layer; a gate electrode and a first conductive layer over the first insulating layer; a second insulating layer over the gate electrode and the first conductive layer; source and drain electrodes and a second conductive layer over the second insulating layer; a third insulating layer over the source and drain electrodes and the second conductive layer; a first electrode and a third conductive layer over the third insulating layer; a planarization film covering an end portion of the first electrode; an electroluminescent layer over the first electrode; and a second electrode over the electroluminescent layer and the planarization film is provided. The second electrode is electrically connected to the third conductive layer through an opening portion provided in the planarization film. The opening portion overlaps with the first, second, and third conductive layers.

20 Claims, 32 Drawing Sheets

(56) References Cited

U.S. PATENT DOCUMENTS

| | | |
|---|---|---|
| 2002/0158835 A1 | 10/2002 | Kobayashi et al. |
| 2003/0122140 A1 | 7/2003 | Yamazaki et al. |
| 2004/0075092 A1 | 4/2004 | Arao |
| 2004/0115989 A1 | 6/2004 | Matsueda et al. |
| 2004/0160170 A1 | 8/2004 | Sato et al. |
| 2005/0012454 A1 | 1/2005 | Yamazaki et al. |
| 2005/0051776 A1 | 3/2005 | Miyagi et al. |
| 2005/0082532 A1 | 4/2005 | Murakami et al. |
| 2005/0258436 A1 | 11/2005 | Arai |
| 2005/0270464 A1 | 12/2005 | Seo et al. |
| 2007/0002199 A1 | 1/2007 | Fujikawa et al. |
| 2007/0132365 A1* | 6/2007 | Kang et al. .................. 313/500 |
| 2009/0145629 A1 | 6/2009 | Mikami et al. |
| 2011/0284913 A1 | 11/2011 | Ibe et al. |
| 2012/0001889 A1 | 1/2012 | Kimura |
| 2012/0018767 A1 | 1/2012 | Ikeda et al. |
| 2012/0018769 A1 | 1/2012 | Seo et al. |
| 2012/0161115 A1 | 6/2012 | Yamazaki et al. |
| 2012/0199869 A1 | 8/2012 | Tsurume |
| 2012/0205678 A1 | 8/2012 | Ikeda et al. |
| 2012/0205700 A1 | 8/2012 | Tanada et al. |
| 2012/0228592 A1 | 9/2012 | Yokoyama et al. |
| 2012/0244643 A1 | 9/2012 | Yamazaki |
| 2012/0248489 A1 | 10/2012 | Yoshizumi et al. |
| 2012/0256227 A1 | 10/2012 | Tsurume et al. |
| 2012/0298973 A1 | 11/2012 | Adachi et al. |

* cited by examiner

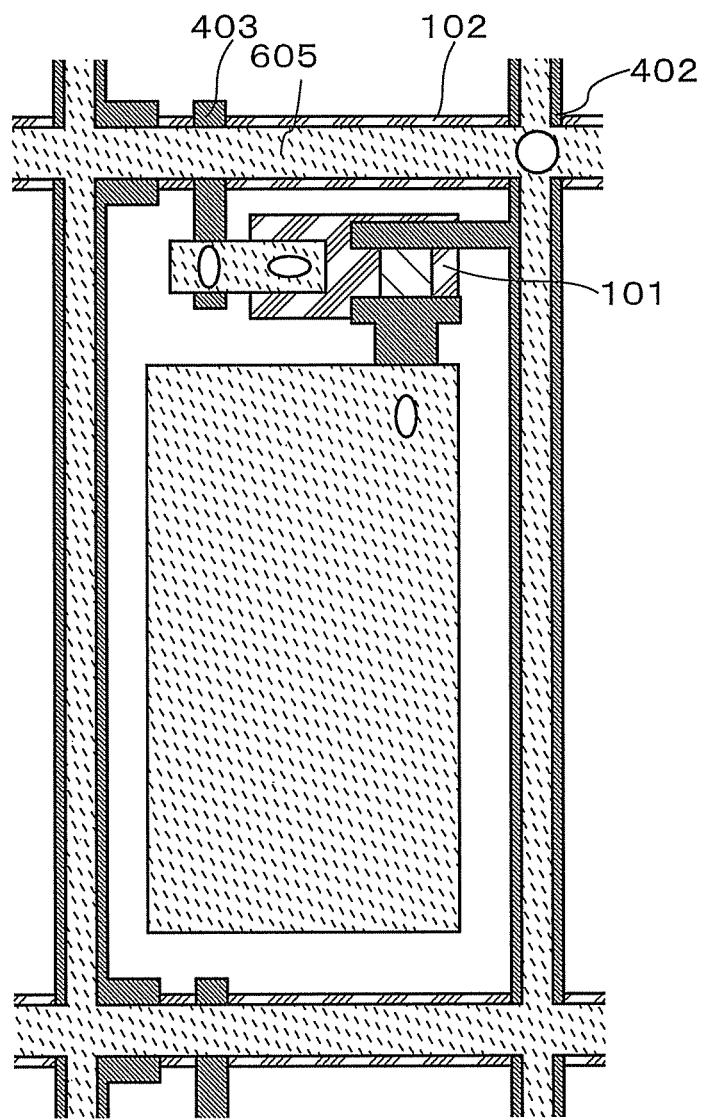

LIGHT-EMITTING DEVICE, DISPLAY DEVICE, AND SEMICONDUCTOR DEVICE

BACKGROUND OF THE INVENTION

1. Field of the Invention

The technical field of the present invention relates to a light-emitting device, a display device (e.g., an EL display device or a liquid crystal display device), a semiconductor device, and the like.

2. Description of the Related Art

Patent Document 1 discloses a light-emitting device in which a pixel electrode is placed over a wiring, which is used for a pixel circuit, with an insulating layer provided therebetween.

REFERENCE

Patent Document

[Patent Document 1] Japanese Published Patent Application No. 2003-257657

SUMMARY OF THE INVENTION

When the structure in Patent Document 1 is employed, a pixel electrode is the only conductive layer which is on and in contact with an insulating layer, and thus a region in which the pixel electrode is not formed has a space in which a conductive layer can be placed.

In view of the above, the first object of one embodiment of the present invention is to make efficient use of a space existing in a region in which a pixel electrode is not formed.

The second object of one embodiment of the present invention is to reduce parasitic capacitance formed in an intersection portion of wirings.

The invention to be disclosed below achieves at least one of the first object and the second object.

The first object can be achieved by forming, in a region in which a pixel electrode is not formed, an auxiliary wiring (auxiliary electrode), a connection wiring which connects one transistor and another transistor, a capacitor electrode, or the like.

In the case where a first wiring and a second wiring intersect with each other, a first opening portion and a second opening portion are provided in the first wiring and the second wiring, respectively.

Further, the second object can be achieved in the following manner: the first opening portion and the second opening portion are placed in an intersection portion of the first wiring and the second wiring, and part or the whole of the first opening portion does not overlap with the second opening portion.

For example, it is possible to provide a light-emitting device which includes a semiconductor layer; a first insulating layer over the semiconductor layer; a gate electrode and a first conductive layer over the first insulating layer; a second insulating layer over the gate electrode and the first conductive layer; a source electrode, a drain electrode, and a second conductive layer over the second insulating layer; a third insulating layer over the source electrode, the drain electrode, and the second conductive layer; a first electrode and a third conductive layer over the third insulating layer; a planarization film covering an end portion of the first electrode; an electroluminescent layer over the first electrode; and a second electrode over the electroluminescent layer and the planarization film. The second electrode is electrically connected to the third conductive layer through an opening portion provided in the planarization film. The opening portion overlaps with the first conductive layer, the second conductive layer, and the third conductive layer.

It is also possible to provide a light-emitting device which includes a gate electrode and a first conductive layer; a first insulating layer over the gate electrode and the first conductive layer; a semiconductor layer and a second conductive layer over the first insulating layer; a source electrode and a drain electrode over the semiconductor layer; a second insulating layer over the source electrode, the drain electrode, and the second conductive layer; a first electrode and a third conductive layer over the second insulating layer; a planarization film covering an end portion of the first electrode; an electroluminescent layer over the first electrode; and a second electrode over the electroluminescent layer and the planarization film. The second electrode is electrically connected to the third conductive layer through an opening portion provided in the planarization film. The opening portion overlaps with the first conductive layer, the second conductive layer, and the third conductive layer.

In the above light-emitting device, it is preferable that one of the first conductive layer, and the second conductive layer be a dummy electrode, and the other of the first conductive layer and the second conductive layer be a wiring.

In the above light-emitting device, it is preferable that one of the first conductive layer and the second conductive layer be a first dummy electrode, and the other of the first conductive layer and the second conductive layer be a second dummy electrode.

In the above light-emitting device, it is preferable that one of the first conductive layer and the second conductive layer be a first wiring, the other of the first conductive layer and the second conductive layer be a second wiring, and the opening portion be provided in an intersection portion of the first wiring and the second wiring.

In the above light-emitting device, it is preferable that a first opening portion be provided in the first conductive layer, and a periphery of the first opening portion be located inside a periphery of the opening portion.

In the above light-emitting device, it is preferable that a second opening portion be provided in the second conductive layer, and a periphery of the second opening portion be located inside the periphery of the opening portion.

In the above light-emitting device, it is preferable that a first opening portion be provided in the first conductive layer, a second opening portion be provided in the second conductive layer, and a periphery of the first opening portion and a periphery of the second opening portion be located inside the periphery of the opening portion.

In the above light-emitting device, it is preferable that the first conductive layer be in the same layer as the gate electrode, the second conductive layer be in the same layer as the source electrode and the drain electrode, and the third conductive layer be in the same layer as the first electrode.

It is also possible to provide a display device which includes a first transistor, a second transistor, a first wiring, a second wiring, a third wiring, and a pixel electrode. The first transistor and the second transistor are inverted-staggered transistors. One of a source and a drain of the first transistor is electrically connected to the first wiring. A gate of the first transistor is electrically connected to the second wiring. One of a source and a drain of the second transistor is electrically connected to the third wiring. The other of the source and the drain of the second transistor is electrically connected to the pixel electrode. The other of the source and the drain of the first transistor and a gate of the second transistor are electrically connected to each other through a connection wiring in the same layer as the pixel electrode.

In the above display device, it is preferable that a capacitor be also provided, a gate electrode of the second transistor double as one electrode of the capacitor, and the third wiring double as the other electrode of the capacitor.

In the above display device, it is preferable that a conductive layer in the same layer as the pixel electrode be also provided, the conductive layer overlap with the third wiring, and the conductive layer be electrically connected to the gate electrode of the second transistor.

In the above display device, it is preferable that the conductive layer be electrically connected to the gate electrode of the second transistor inside an opening portion provided in the third wiring.

It is also possible to provide a semiconductor device which includes a transistor, a first wiring, and a second wiring. The first wiring is electrically connected to one of a source and a drain of the transistor. The second wiring is electrically connected to a gate of the transistor. The first wiring has a first opening portion. The second wiring has a second opening portion. The first opening portion and the second opening portion are provided in an intersection portion of the first wiring and the second wiring. The intersection portion has a region in which the first opening portion and the second opening portion do not overlap with each other.

It is also possible to provide a semiconductor device which includes a transistor, a first wiring, a second wiring, a third wiring, and a capacitor. The first wiring is electrically connected to one of a source and a drain of the transistor. The second wiring is electrically connected to a gate of the transistor. The third wiring is electrically connected to one electrode of the capacitor. The other of the source and the drain of the transistor and the other electrode of the capacitor are electrically connected to each other. The first wiring has a first opening portion. The third wiring has a third opening portion. The first opening portion and the third opening portion are provided in an intersection portion of the first wiring and the third wiring. The intersection portion has a region in which the first opening portion and the third opening portion do not overlap with each other.

It is also possible to provide a semiconductor device which includes a transistor, a first wiring, a second wiring, a third wiring, and a capacitor. The first wiring is electrically connected to one of a source and a drain of the transistor. The second wiring is electrically connected to a gate of the transistor. The third wiring is electrically connected to one electrode of the capacitor. The other of the source and the drain of the transistor and the other electrode of the capacitor are electrically connected to each other. The first wiring has a first opening portion. The second wiring has a second opening portion. The third wiring has a third opening portion. The first wiring has a fourth opening portion. The first opening portion and the second opening portion are provided in a first intersection portion of the first wiring and the second wiring. The third opening portion and the fourth opening portion are provided in a second intersection portion of the first wiring and the third wiring. The first intersection portion has a region in which the first opening portion and the second opening portion do not overlap with each other. The second intersection portion has a region in which the third opening portion and the fourth opening portion do not overlap with each other.

Note that in this specification, a dummy electrode (an electrically isolated electrode or a floating electrode) means an electrode in an electrically floating state to which no current or voltage is supplied.

Note that in this specification, a dummy semiconductor layer (an electrically isolated semiconductor layer or a floating semiconductor layer) means a semiconductor layer in an electrically floating state to which no current or voltage is supplied.

Further, in this specification, "A is in the same layer as B" means that "A and B have been formed in the same step" or "A and B have been formed using the same material."

"A and B have been formed in the same step" or "A and B have been formed using the same material" means that, for example, A and B have been formed by patterning a predetermined film (starting film).

Note that patterning refers to, for example, a process in which a mask is formed over a predetermined film (starting film), the predetermined film (starting film) is processed into a predetermined shape with the use of the mask, and the mask is removed.

Therefore, the concept that "A and B have been formed in the same step" or "A and B have been formed using the same material" includes the concept that "A and B have been formed using the same starting film."

In another example where A and B are formed by a printing method (e.g., an ink-jet method or a letterpress printing method), "A and B have been formed in the same step" or "A and B have been formed using the same material" means that printing have been performed such that patterns of both A and B are formed.

By achieving the first object, a space existing in a region in which a pixel electrode is not formed can be efficiently used.

By achieving the second object, parasitic capacitance formed in an intersection portion of wirings can be reduced.

BRIEF DESCRIPTION OF THE DRAWINGS

FIG. 15 illustrates an example of a light-emitting device.

DETAILED DESCRIPTION OF THE INVENTION

Figure 1:
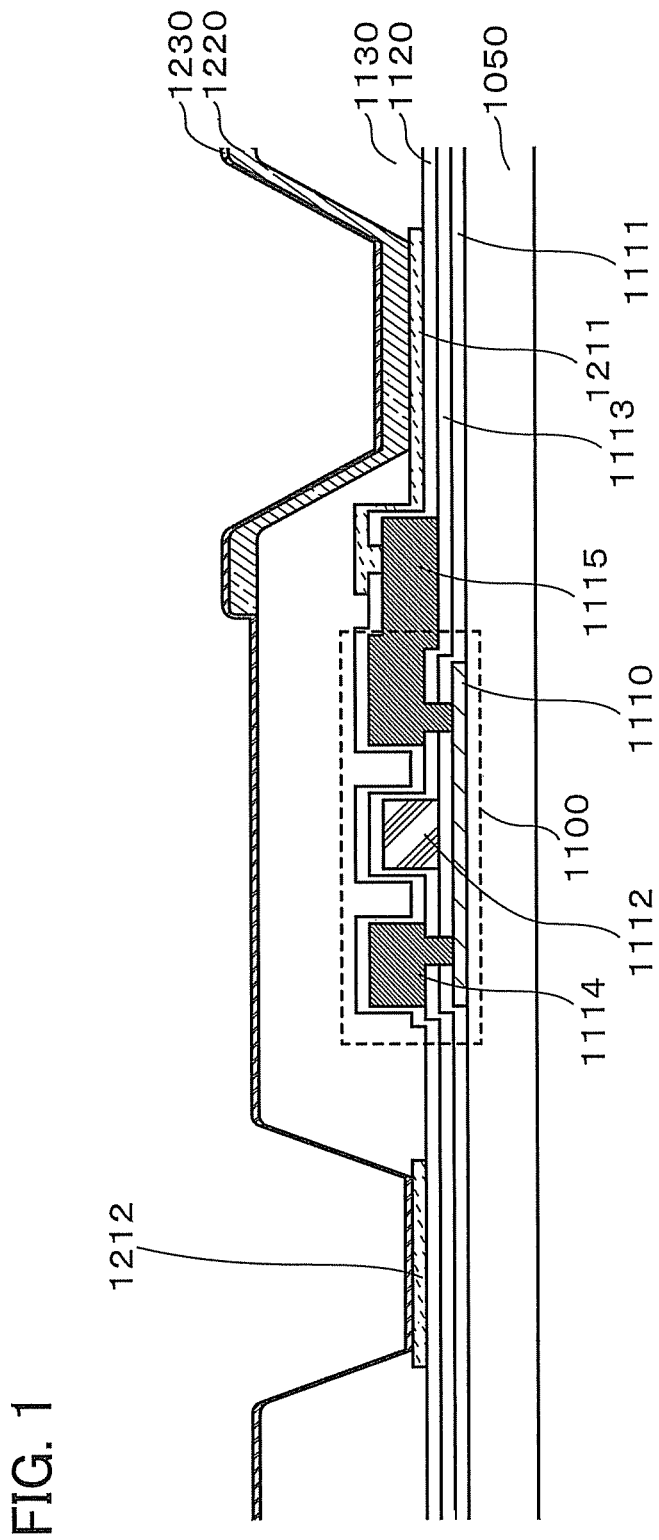
FIG. 1 illustrates an example of a light-emitting device.

Embodiments will be described with reference to the drawings.

It is easily understood by those skilled in the art that modes and details thereof can be modified in various ways without departing from the spirit and scope of the present invention.

Thus, the present invention should not be interpreted as being limited to what is described in the embodiments described below.

In the structures to be given below, the same portions or portions having similar functions are denoted by the same reference numerals in different drawings, and explanation thereof will not be repeated.

Some or all of the following embodiments can be combined as appropriate.

Embodiment 1

An example of a light-emitting device is shown in FIG. 1.

A semiconductor layer 1110 is formed over a substrate 1050 having an insulating surface.

An insulating layer 1111 is formed over the semiconductor layer.

The semiconductor layer includes at least a channel formation region, a source region, and a drain region.

The insulating layer 1111 corresponds to a gate insulating film of a transistor 1100.

A conductive layer 1112 is formed over the insulating layer 1111.

The conductive layer 1112 corresponds to a gate electrode of the transistor 1100 and is formed so as to overlap with the channel formation region.

An insulating layer 1113 is formed over the conductive layer 1112.

The insulating layer 1113 corresponds to an interlayer insulating film.

A conductive layer 1114 and a conductive layer 1115 are formed over the insulating layer 1113.

The conductive layer 1114 corresponds to one of a source electrode and a drain electrode of the transistor 1100.

The conductive layer 1114 is electrically connected to one of the source region and the drain region of the semiconductor layer through a contact hole formed in the insulating layer 1111 and the insulating layer 1113.

The conductive layer 1115 corresponds to the other of the source electrode and the drain electrode of the transistor 1100.

The conductive layer 1115 is electrically connected to the other of the source region and the drain region of the semiconductor layer through a contact hole formed in the insulating layer 1111 and the insulating layer 1113.

An insulating layer 1120 is formed over the conductive layer 1114 and the conductive layer 1115.

The insulating layer 1120 corresponds to an interlayer insulating film.

A conductive layer 1211 and a conductive layer 1212 are formed over the insulating layer 1120.

The conductive layer 1211 corresponds to a first electrode (a pixel electrode or a lower electrode) of a light-emitting element.

The conductive layer 1211 is electrically connected to the conductive layer 1115 through a contact hole formed in the insulating layer 1120.

The conductive layer 1212 is electrically connected to a conductive layer 1230 which corresponds to a second electrode (a counter electrode or an upper electrode) of the light-emitting element, and functions as an auxiliary wiring (auxiliary electrode) of the conductive layer 1230.

Note that for a reduction in the number of steps, the conductive layer 1211 and the conductive layer 1212 are preferably formed in the same step. In other words, the conductive layer 1211 is preferably in the same layer as the conductive layer 1212.

It is needless to say that the conductive layer 1211 and the conductive layer 1212 may be formed in different steps.

An insulating layer 1130 is formed over the conductive layer 1211 and the conductive layer 1212.

The insulating layer 1130 corresponds to a partition layer.

In the insulating layer 1130, an opening portion for exposing part of a surface of the conductive layer 1211 and an opening portion for exposing part of a surface of the conductive layer 1212 are provided.

In other words, the insulating layer 1130 covers an end portion of the conductive layer 1211 and end portions of the conductive layer 1212.

An electroluminescent layer 1220 (an EL layer or an electric field light-emitting layer) is formed over the conductive layer 1211 and the insulating layer 1130.

The conductive layer 1230 is formed over the electroluminescent layer 1220, the insulating layer 1130, and the conductive layer 1212.

In other words, the conductive layer 1230 is electrically connected to the conductive layer 1212 through an opening portion (contact hole) provided in the insulating layer 1130.

The conductive layer 1230 corresponds to the second electrode (the counter electrode or the upper electrode) of the light-emitting element.

With the structure illustrated in FIG. 1, the conductive layer 1212 which is formed in a region in which the conductive layer 1211 is not formed can be used as the auxiliary wiring of the conductive layer 1230.

Thus, a space in a region in which the pixel electrode is not formed can be efficiently used.

Note that although the transistor 1100 which is provided over the substrate 1050 in FIG. 1 is a top-gate TFT, the transistor 1100 may be a bottom-gate TFT, or a transistor formed using a silicon wafer, an SOI substrate, or the like.

Part or the whole of the structure described in this embodiment can be combined with part or the whole of a structure described in any of the other embodiments.

Embodiment 2

The case where a planarization film is used as the partition layer will be described.

A planarization film refers to an insulating film having a plane surface.

Typical examples of a planarization film include an insulating film which is formed in such a manner that a liquid raw material is discharged on a substrate and then cured.

An organic insulating film is one of examples of an insulating film which is formed in such a manner that a liquid raw material is discharged on a substrate and then cured.

Examples of an organic insulating film include a polyimide film, an acrylic film, and a siloxane film.

Since a liquid raw material is used for an organic insulating film, the larger the height of a structure formed under the film is, the shorter the distance between the structure and a surface of the film is.

Therefore, the larger the height of the structure formed under the film is, the smaller the depth of the opening portion is.

Note that instead of the planarization film, for example, an insulating film whose surface is planarized by polishing using chemical mechanical polishing (CMP) or the like may be used.

The insulating film whose surface is polished is formed in such a manner that an insulating film whose surface reflects unevenness of a structure under the insulating film is formed, and then the surface is planarized by polishing; thus, the shape of the insulating film is similar to that of an insulating film formed using a liquid raw material.

Figure 2:
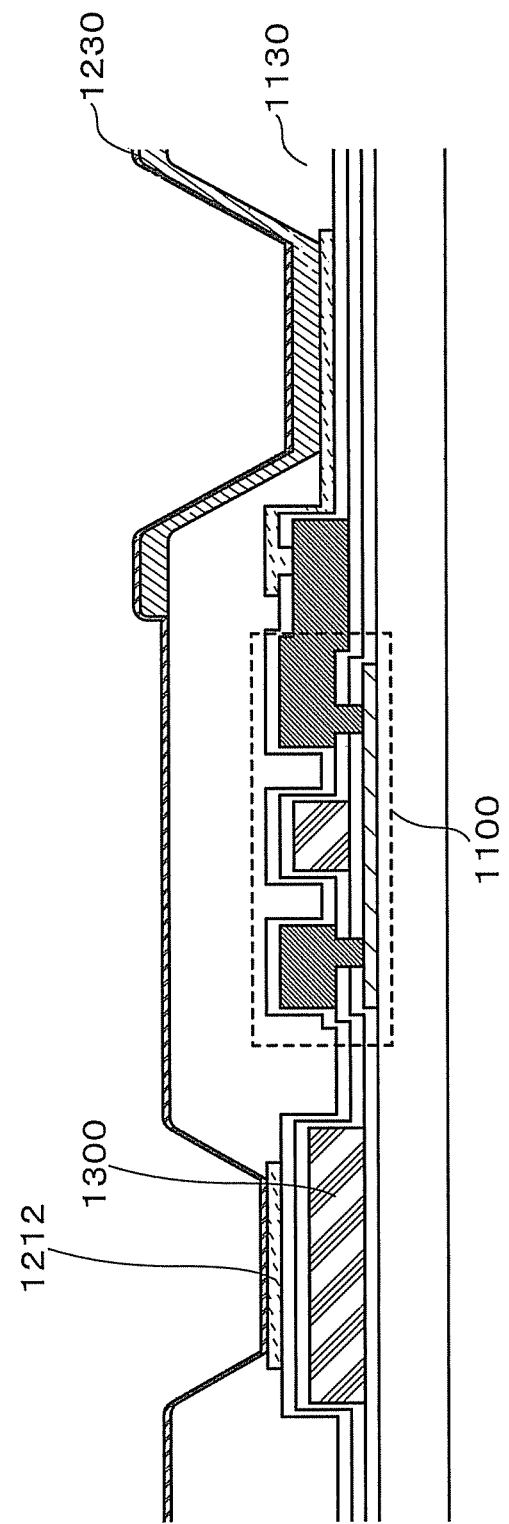
FIG. 2 illustrates an example of a light-emitting device.
Figure 3:
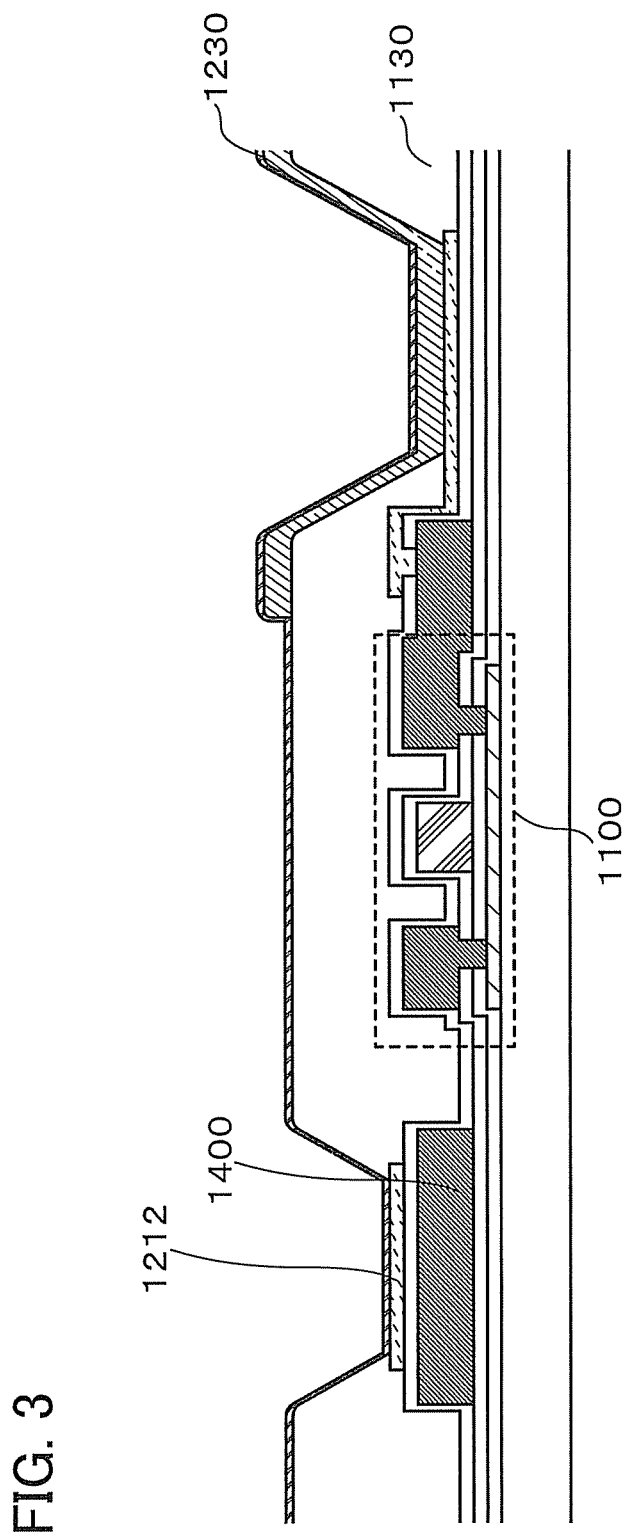
FIG. 3 illustrates an example of a light-emitting device.

Examples of a structure in which the bottom surface of the opening portion is raised in view of the above are shown in FIG. 2 and FIG. 3.

A structure in FIG. 2 is different from that in FIG. 1 in that a conductive layer 1300 is provided.

For a reduction in the number of steps, the conductive layer 1300 is preferably formed in the same step as the gate electrode of the transistor 1100.

A structure in FIG. 3 is different from that in FIG. 1 in that a conductive layer 1400 is provided.

For a reduction in the number of steps, the conductive layer 1400 is preferably formed in the same step as the source electrode and the drain electrode of the transistor 1100.

The conductive layer 1300 or the conductive layer 1400 is, for example, a wiring used for the light-emitting device, a dummy electrode (an electrically isolated electrode or a floating electrode), or the like.

As the wiring used for the light-emitting device, for example, a gate wiring, a capacitor wiring, a signal line, a power supply line, an erase line, or the like can be used.

The dummy electrode (the electrically isolated electrode or the floating electrode) is an electrode which is electrically separated from the wiring or electrode used for the light-emitting device.

Further, the conductive layer 1300 or the conductive layer 1400 is formed so as to overlap with the opening portion formed in the insulating layer 1130 for the electrical connection between the conductive layer 1212 and the conductive layer 1230.

Note that at least an edge (an end or a periphery) of the opening portion is formed so as to overlap with the conductive layer 1300 or the conductive layer 1400.

When the conductive layer is placed so as to overlap with the opening portion as described above, the possibility of disconnection of the conductive layer 1230 can be lowered.

In other words, the bottom surface of the opening portion is raised by providing the conductive layer under the opening portion, whereby a step formed by the opening portion becomes small.

Further, when the step formed by the opening portion is small, the possibility of disconnection of the conductive layer 1230 can be lowered.

Note that in FIG. 2 and FIG. 3, a dummy semiconductor layer (an electrically isolated semiconductor layer or a floating semiconductor layer) is preferably placed so as to overlap with the opening portion, in which case the possibility of disconnection of the conductive layer 1230 can be further lowered.

The dummy semiconductor layer is preferably formed in the same step as the semiconductor layer of the transistor.

Part or the whole of the structure described in this embodiment can be combined with part or the whole of a structure described in any of the other embodiments.

Embodiment 3

Figure 4:
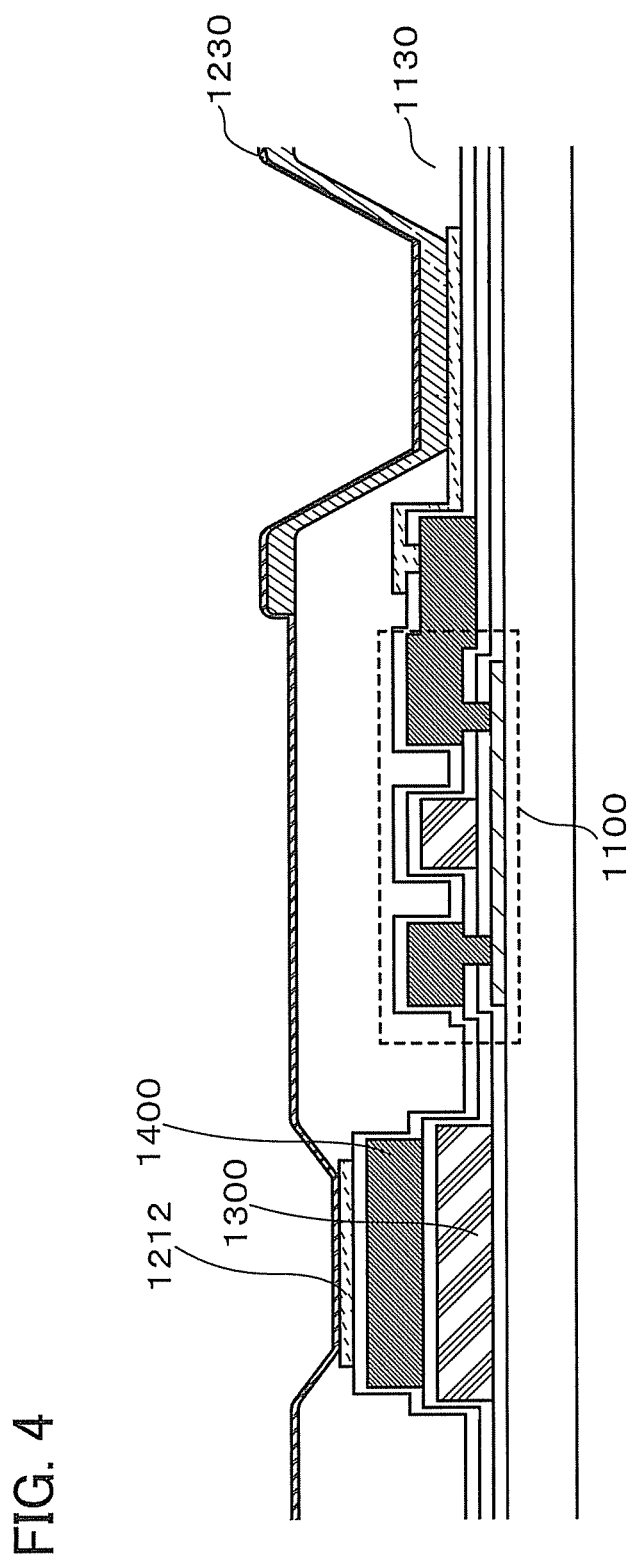
FIG. 4 illustrates an example of a light-emitting device.

An example of a structure in FIG. 4 is different from the structure in FIG. 1 in that both the conductive layer 1300 and the conductive layer 1400 are provided. Note that in FIG. 4, a planarization film is used as the partition layer.

For a reduction in the number of steps, the conductive layer 1300 is preferably formed in the same step as the gate electrode of the transistor 1100.

For a reduction in the number of steps, the conductive layer 1400 is preferably formed in the same step as the source electrode and the drain electrode of the transistor 1100.

It is preferable to provide both the conductive layer 1300 and the conductive layer 1400 as shown in FIG. 4 because in that case, the possibility of disconnection of the conductive layer 1230 can be lower than that in the structures in FIG. 2 and FIG. 3.

The conductive layer 1300 or the conductive layer 1400 is, for example, a wiring used for the light-emitting device, a dummy electrode (an electrically isolated electrode or a floating electrode), or the like.

As the wiring used for the light-emitting device, for example, a gate wiring, a capacitor wiring, a signal line, a power supply line, an erase line, or the like can be used.

The dummy electrode (the electrically isolated electrode or the floating electrode) is an electrode which is electrically separated from the wiring or electrode used for the light-emitting device.

For example, when an opening portion is provided in an intersection portion of two wirings, the conductive layer 1300 and the conductive layer 1400 correspond to a first wiring and a second wiring, respectively.

For example, when one wiring and a dummy electrode overlap with an opening portion, the conductive layer 1300 corresponds to one of the wiring and the dummy electrode, and the conductive layer 1400 corresponds to the other of the wiring and the dummy electrode.

For example, when two dummy electrodes overlap with an opening portion, the conductive layer 1300 corresponds to a first dummy electrode, and the conductive layer 1400 corresponds to a second dummy electrode.

Note that in FIG. 4, a dummy semiconductor layer (an electrically isolated semiconductor layer or a floating semiconductor layer) is preferably placed so as to overlap with the opening portion, in which case the possibility of disconnection of the conductive layer 1230 can be further lowered.

The dummy semiconductor layer is preferably formed in the same step as the semiconductor layer of the transistor.

Part or the whole of the structure described in this embodiment can be combined with part or the whole of a structure described in any of the other embodiments.

Embodiment 4

In the case where a planarization film is used as the partition layer, a dummy electrode or a dummy semiconductor layer may be placed under the pixel electrode so that the possibility of disconnection in a light-emitting region is lowered.

It is needless to say that both the dummy electrode and the dummy semiconductor layer may be placed under the pixel electrode.

The dummy semiconductor layer is preferably formed in the same step as the semiconductor layer of the transistor.

The dummy electrode is preferably formed in the same step as the gate electrode of the transistor.

The dummy electrode is preferably formed in the same step as the source electrode and the drain electrode of the transistor.

Part or the whole of the structure described in this embodiment can be combined with part or the whole of a structure described in any of the other embodiments.

Embodiment 5

FIG. 5, FIG. 6, and FIGS. 7A to 7C illustrate an example of a light-emitting device including a channel-etched TFT that is a kind of an inverted-staggered TFT.

Figure 5:
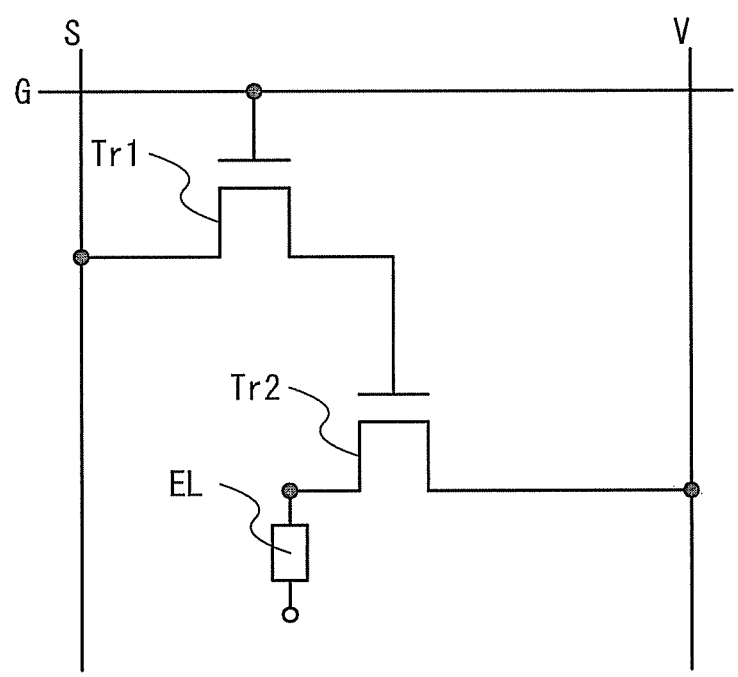
FIG. 5 illustrates an example of a light-emitting device.

FIG. 5 is a circuit diagram of a pixel circuit used for the light-emitting device which is illustrated in FIG. 6 and FIGS. 7A to 7C.

The pixel circuit illustrated in FIG. 5 includes a transistor Tr1, a transistor Tr2, a wiring G, a wiring S, a wiring V, and a light-emitting element EL (EL element).

The transistor Tr1 has the function of controlling conduction and non-conduction of the transistor Tr2.

The transistor Tr1 is also called a switching transistor.

The transistor Tr2 has the function of controlling current supplied to the light-emitting element EL.

The transistor Tr2 is also called a driver transistor.

The wiring G corresponds to a gate line, for example.

The gate line is electrically connected to a gate of the transistor Tr1, and has the function of supplying a signal that controls conduction and non-conduction of the transistor Tr1.

The wiring S corresponds to a signal line, for example.

The signal line has the function of supplying a video signal.

The wiring V corresponds to a power supply line, for example.

The power supply line has the function of supplying current or voltage.

The wiring G is electrically connected to the gate of the transistor Tr1.

The wiring S is electrically connected to one of a source and a drain of the transistor Tr1.

The wiring V is electrically connected to one of a source and a drain of the transistor Tr2.

The light-emitting element EL is electrically connected to the other of the source and the drain of the transistor Tr2.

The other of the source and the drain of the transistor Tr1 is electrically connected to a gate of the transistor Tr2.

Figure 6:
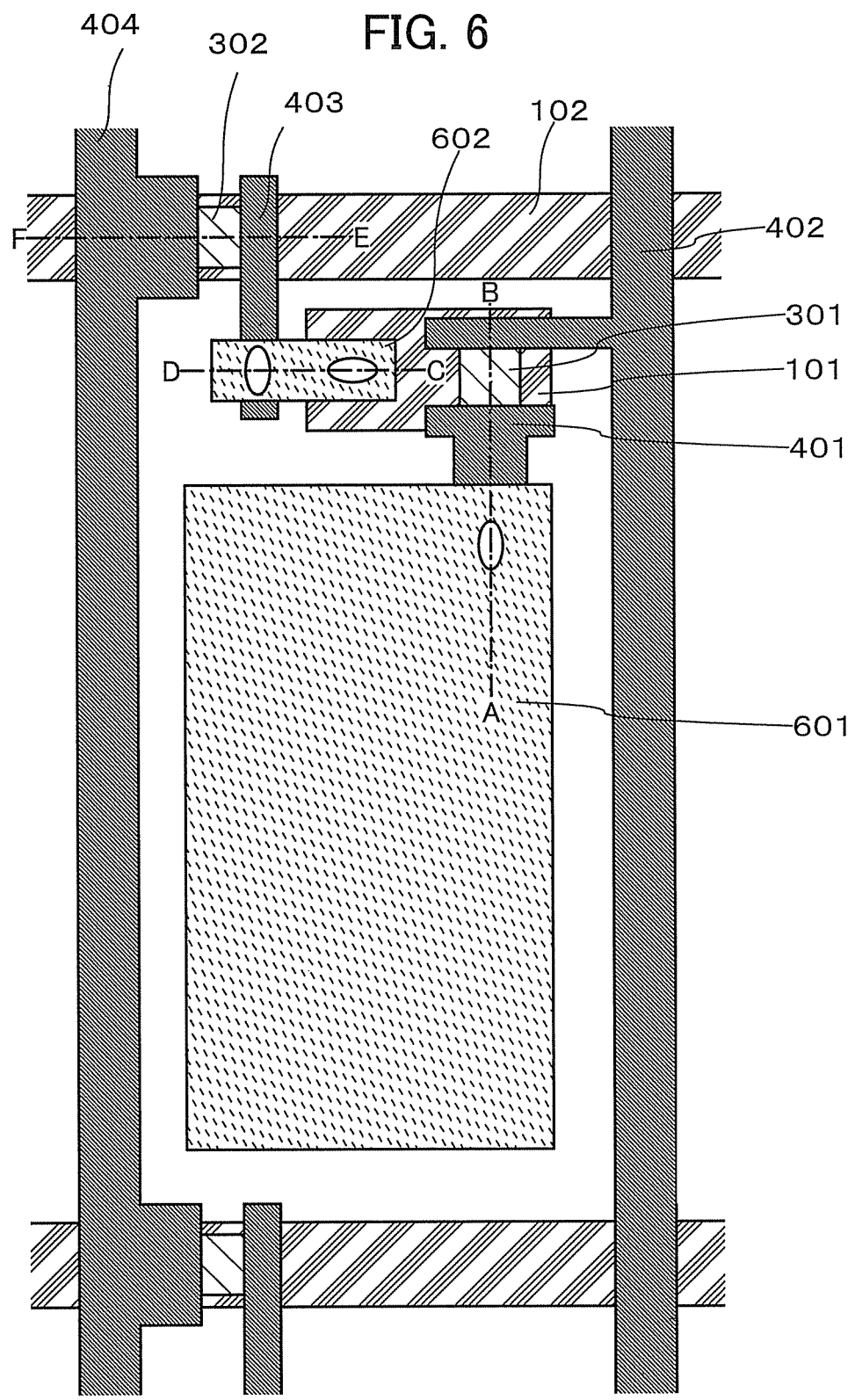
FIG. 6 illustrates an example of a light-emitting device.
Figure 7A:
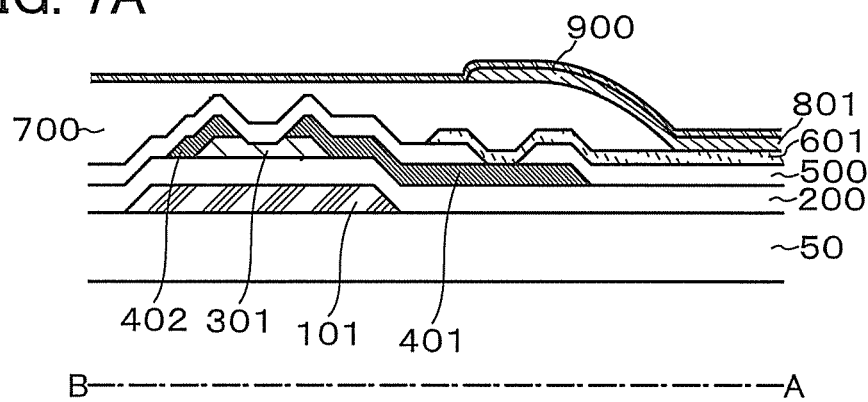
FIGS. 7A to 7C illustrate an example of a light-emitting device.

FIG. 7A corresponds to a cross-sectional view taken along line A-B in FIG. 6.

FIG. 7A also corresponds to a cross-sectional view of the transistor Tr2 in FIG. 5.

Figure 7B:
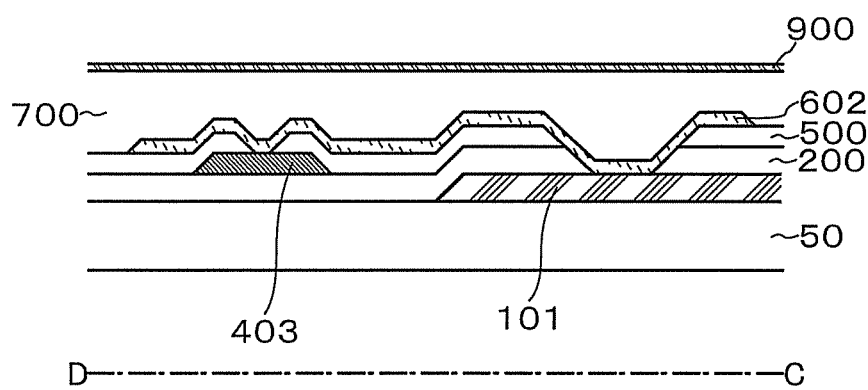

FIG. 7B corresponds to a cross-sectional view taken along line C-D in FIG. 6.

FIG. 7B also corresponds to a cross-sectional view of a connection portion of the other of the source and the drain of the transistor Tr1 and the gate of the transistor Tr2 in FIG. 5.

Figure 7C:
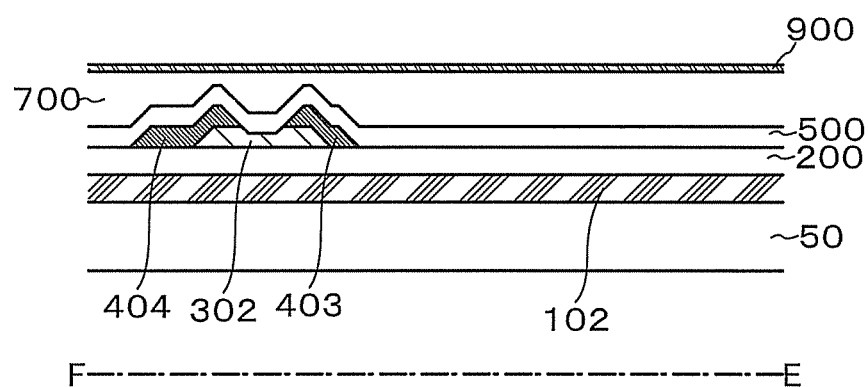

FIG. 7C corresponds to a cross-sectional view taken along line E-F in FIG. 6.

FIG. 7C also corresponds to a cross-sectional view of the transistor Tr1 in FIG. 5.

Further, in FIG. 6 and FIGS. 7A to 7C, a conductive layer 101 and a conductive layer 102 are formed over a substrate 50 having an insulating surface.

The conductive layer 101 corresponds to a gate electrode of the transistor Tr2.

Further, the conductive layer 101 also functions as part of a connection wiring for electrical connection between the other of the source and the drain of the transistor Tr1 and the gate of the transistor Tr2.

The conductive layer 102 corresponds to a gate electrode of the transistor Tr1.

The conductive layer 102 also functions as the wiring G (gate line).

An insulating layer 200 is formed over the conductive layer 101 and the conductive layer 102.

The insulating layer 200 functions as a gate insulating film of the transistor Tr1 and a gate insulating film of the transistor Tr2.

A semiconductor layer 301 and a semiconductor layer 302 are formed over the insulating layer 200.

The semiconductor layer 301 corresponds to a semiconductor layer of the transistor Tr2.

The semiconductor layer 302 corresponds to a semiconductor layer of the transistor Tr1.

A conductive layer 401 and a conductive layer 402 are formed over the semiconductor layer 301.

The conductive layer 401 corresponds to one of a source electrode and a drain electrode of the transistor Tr2.

The conductive layer 401 also functions as a connection wiring connected to a conductive layer 601 that is a pixel electrode.

The conductive layer 402 corresponds to the other of the source electrode and the drain electrode of the transistor Tr2.

The conductive layer 402 also functions as the wiring V (power supply line).

A conductive layer 403 and a conductive layer 404 are formed over the semiconductor layer 302.

The conductive layer 403 corresponds to one of a source electrode and a drain electrode of the transistor Tr1.

Further, the conductive layer 403 also functions as part of a connection wiring for electrical connection between the other of the source and the drain of the transistor Tr1 and the gate of the transistor Tr2.

The conductive layer 404 corresponds to the other of the source electrode and the drain electrode of the transistor Tr1.

The conductive layer 404 also functions as the wiring S (signal line).

An insulating layer 500 is formed over the conductive layer 401, the conductive layer 402, the conductive layer 403, and the conductive layer 404.

The insulating layer 500 corresponds to an interlayer insulating film.

The conductive layer 601 and a conductive layer 602 are formed over the insulating layer 500.

The conductive layer 601 corresponds to a first electrode (a pixel electrode or a lower electrode) of a light-emitting element.

The conductive layer 601 is electrically connected to the conductive layer 401 through a contact hole formed in the insulating layer 500.

The conductive layer 602 functions as part of a connection wiring for electrical connection between the other of the source and the drain of the transistor Tr1 and the gate of the transistor Tr2.

The conductive layer 602 is electrically connected to the conductive layer 403 through a first contact hole formed in the insulating layer 500, and is electrically connected to the conductive layer 101 through a second contact hole formed in the insulating layer 200 and the insulating-layer 500.

Note that the longitudinal direction of a region where upper and lower conductive layers overlap with each other is preferably parallel to the longitudinal direction of the contact hole as shown in FIG. 6, in which case the area of the contact hole can be large.

Therefore, in FIG. 6, the longitudinal direction of the first contact hole intersects with the longitudinal direction of the second contact hole.

For a reduction in the number of steps, it is preferable that the first contact hole and the second contact hole be formed in the same step and the conductive layer 601 and the conductive layer 602 be formed in the same step.

If the conductive layer 403 and the conductive layer 101 are made in contact with each other for electrical connection between the other of the source and the drain of the transistor Tr1 and the gate of the transistor Tr2, a step of forming a contact hole after formation of the insulating layer 200 and before formation of the insulating layer 500 is needed.

In contrast, when the conductive layer 602 is used as part of the connection wiring for electrical connection between the other of the source and the drain of the transistor Tr1 and the gate of the transistor Tr2 as shown in FIG. 6 and FIGS. 7A to 7C, a step of forming a contact hole after the formation of the insulating layer 200 and before the formation of the insulating layer 500 is not needed.

That is, in the structure illustrated in FIG. 6 and FIGS. 7A to 7C, the first contact hole and the second contact hole can be formed at the same time, which makes it unnecessary to perform a step of forming a contact hole after the formation of the insulating layer 200 and before the formation of the insulating layer 500.

Therefore, in the case of the structure illustrated in FIG. 6 and FIGS. 7A to 7C, one step of forming a contact hole can be omitted.

An insulating layer 700 is formed over the conductive layer 601 and the conductive layer 602.

The insulating layer 700 corresponds to a partition layer.

In the insulating layer 700, an opening portion for exposing part of a surface of the conductive layer 601 is provided.

In other words, the insulating layer 700 covers an end portion of the conductive layer 601.

An electroluminescent layer 801 (an EL layer or an electric field light-emitting layer) is formed over the conductive layer 601 and the insulating layer 700.

A conductive layer 900 is formed over the electroluminescent layer 801 and the insulating layer 700.

The conductive layer 900 corresponds to the second electrode (the counter electrode or the upper electrode) of the light-emitting element.

As described above, in the structure in which the conductive layer 602 is used as the connection wiring, the number of steps can be reduced.

Further, since the conductive layer 602 is formed in a space in which the pixel electrode does not exist, the space in which the pixel electrode does not exist can be efficiently used.

Although a channel-etched TFT is employed in this embodiment, a channel-stop TFT may also be employed.

Note that the light-emitting element in this embodiment may be substituted with another display element (e.g., a liquid crystal element or an electrophoretic element).

That is, this embodiment can be applied to general display devices.

Part or the whole of the structure described in this embodiment can be combined with part or the whole of a structure described in any of the other embodiments.

Embodiment 6

Figure 8:
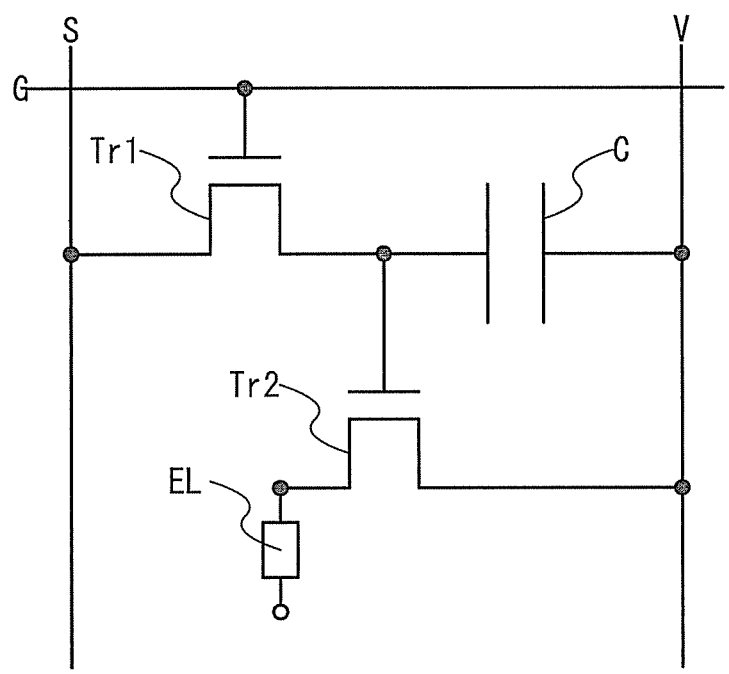
FIG. 8 illustrates an example of a light-emitting device.
Figure 9:
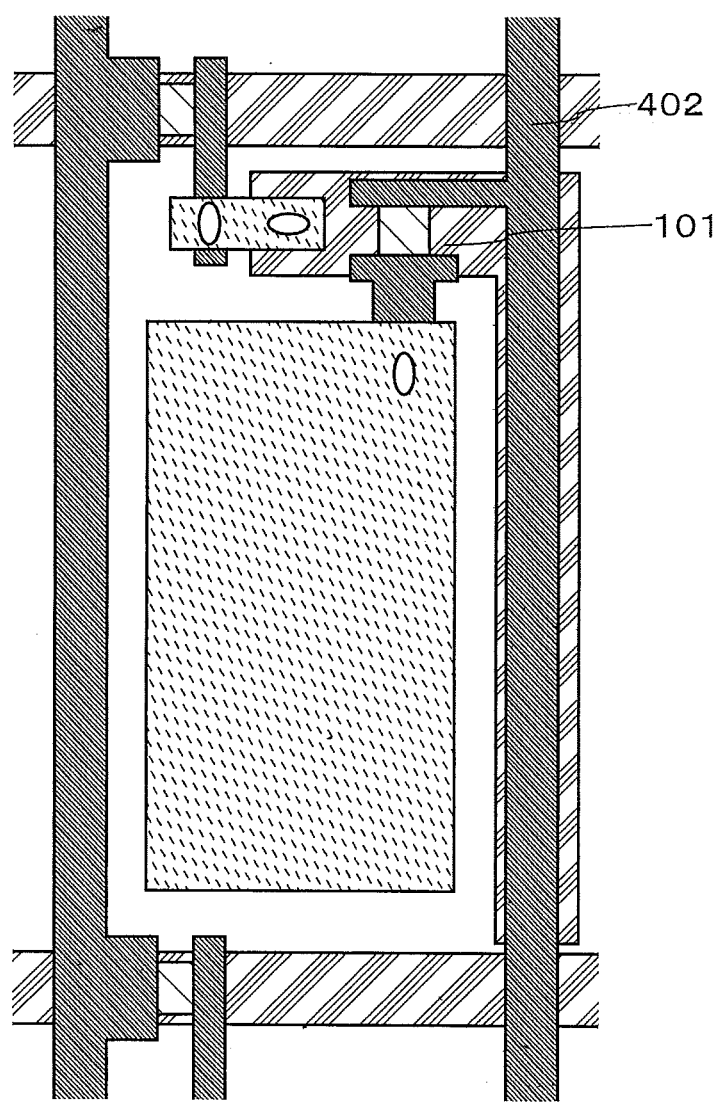
FIG. 9 illustrates an example of a light-emitting device.

An example of a structure in FIG. 8 and FIG. 9 is different from the structure illustrated in FIG. 5, FIG. 6, and FIGS. 7A to 7C in that a capacitor is provided.

FIG. 8 corresponds to a circuit diagram of a pixel circuit in FIG. 9.

An example in FIG. 8 is different from that in FIG. 5 in that a capacitor C is provided.

One terminal (one electrode) of the capacitor C is electrically connected to the gate of the transistor Tr2.

The other terminal (the other electrode) of the capacitor C is electrically connected to the wiring V (power supply line).

In this embodiment, the one electrode of the capacitor C doubles as the gate electrode of the transistor Tr2.

Further, the other electrode of the capacitor C doubles as the wiring V (power supply line).

Here, FIG. 9 illustrates a structure in which the conductive layer 101 extends under the conductive layer 402 in FIG. 6.

The one electrode of the capacitor C doubles as the gate electrode of the transistor Tr2, and the other electrode of the capacitor C doubles as the wiring V (power supply line), so that the capacitor can be formed without a reduction in aperture ratio.

Note that the light-emitting element in this embodiment may be substituted with another display element (e.g., a liquid crystal element or an electrophoretic element).

That is, this embodiment can be applied to general display devices.

Part or the whole of the structure described in this embodiment can be combined with part or the whole of a structure described in any of the other embodiments.

Embodiment 7

Figure 10A:
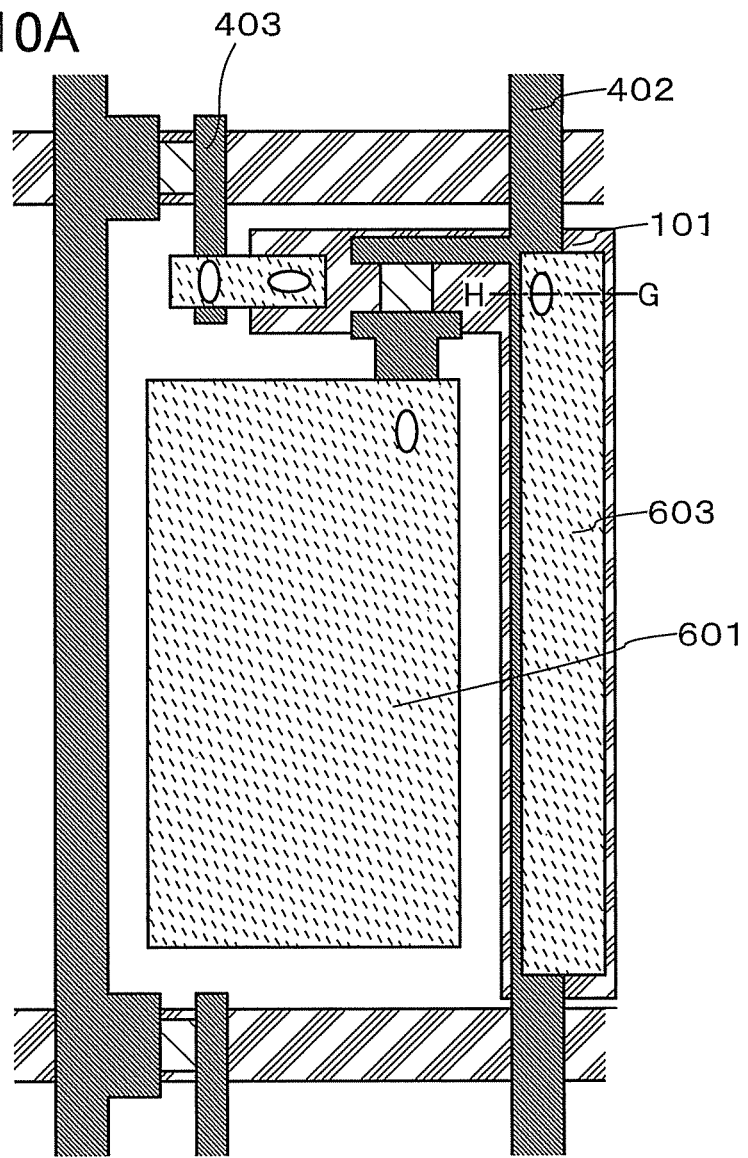
FIGS. 10A and 10B illustrate an example of a light-emitting device.
Figure 10B:
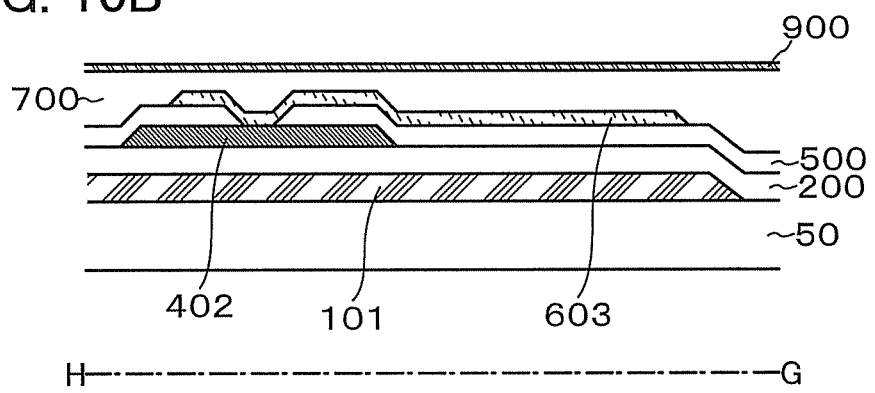

A structure in which the capacity of the capacitor is increased is illustrated in FIGS. 10A and 10B.

A structure in FIG. 10A is different from that in FIG. 9 in that a conductive layer 603 is provided.

FIG. 10B corresponds to a cross-sectional view taken along line G-H in FIG. 10A.

Note that the circuit diagram in FIG. 8 also applies to the pixel circuit in FIGS. 10A and 10B.

The conductive layer 603 forms part of the other electrode of the capacitor C.

The conductive layer 603 and the conductive layer 601 that is the pixel electrode are preferably formed in the same step, which prevents an increase in the number of steps.

The conductive layer 603 is electrically connected to the conductive layer 402 through a contact hole provided in the insulating layer 500.

Note that it is preferable to provide a plurality of contact holes for a reduction of contact resistance between the conductive layer 603 and the conductive layer 402.

With the above structure, the width of the other electrode of the capacitor C can be large, and thus the capacity of the capacitor C can be increased.

Further, since the conductive layer 603 is formed in a space in which the pixel electrode does not exist, the space in which the pixel electrode does not exist can be efficiently used.

Note that in FIGS. 10A and 10B, the conductive layer 403 and the conductive layer 101 may be in direct contact with each other.

Note that the light-emitting element in this embodiment may be substituted with another display element (e.g., a liquid crystal element or an electrophoretic element).

That is, this embodiment can be applied to general display devices.

Part or the whole of the structure described in this embodiment can be combined with part or the whole of a structure described in any of the other embodiments.

Embodiment 8

Figure 11A:
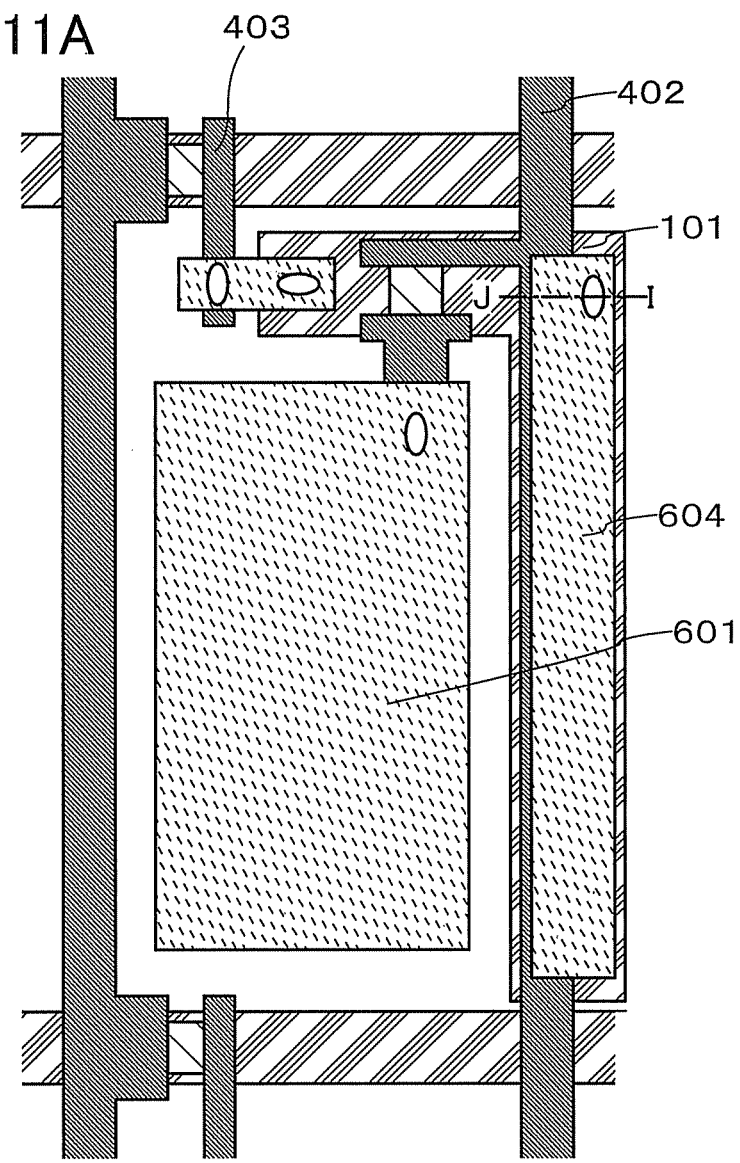
FIGS. 11A and 11B illustrate an example of a light-emitting device.
Figure 11B:
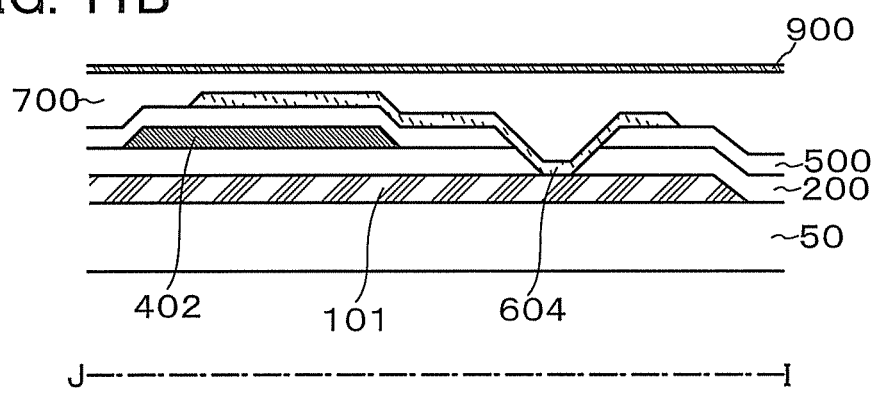

A structure in which the capacity of the capacitor is increased is illustrated in FIGS. 11A and 11B.

A structure in FIG. 11A is different from that in FIG. 9 in that a conductive layer 604 is provided.

FIG. 11B corresponds to a cross-sectional view taken along line I-J in FIG. 11A.

Note that the circuit diagram in FIG. 8 also applies to the pixel circuit in FIGS. 11A and 11B.

The conductive layer 604 forms part of the one electrode of the capacitor C.

The conductive layer 604 and the conductive layer 601 that is the pixel electrode are preferably formed in the same step, which prevents an increase in the number of steps.

The conductive layer 604 is electrically connected to the conductive layer 101 through a contact hole provided in the insulating layer 200 and the insulating layer 500.

Note that it is preferable to provide a plurality of contact holes for a reduction of contact resistance between the conductive layer 604 and the conductive layer 101.

With the above structure, in which the other electrode of the capacitor C is interposed between the one electrodes of the capacitors, the capacity of the capacitor C can be increased.

Further, when the area of the conductive layer 604 in FIGS. 11A and 11B and the area of the conductive layer 603 in FIGS. 10A and 10B are the same, the capacity of the capacitor C in FIGS. 11A and 11B is larger than that of the capacitor C in FIGS. 10A and 10B since the other terminal (the other electrode) of the capacitor C is interposed between the one terminals (one electrodes) of the capacitors in FIGS. 11A and 11B.

Further, since the conductive layer 604 is formed in a space in which the pixel electrode does not exist, the space in which the pixel electrode does not exist can be efficiently used.

Note that in FIGS. 11A and 11B, the conductive layer 403 and the conductive layer 101 may be in direct contact with each other.

Note that the light-emitting element in this embodiment may be substituted with another display element (e.g., a liquid crystal element or an electrophoretic element).

That is, this embodiment can be applied to general display devices.

Part or the whole of the structure described in this embodiment can be combined with part or the whole of a structure described in any of the other embodiments.

Embodiment 9

Figure 12A:
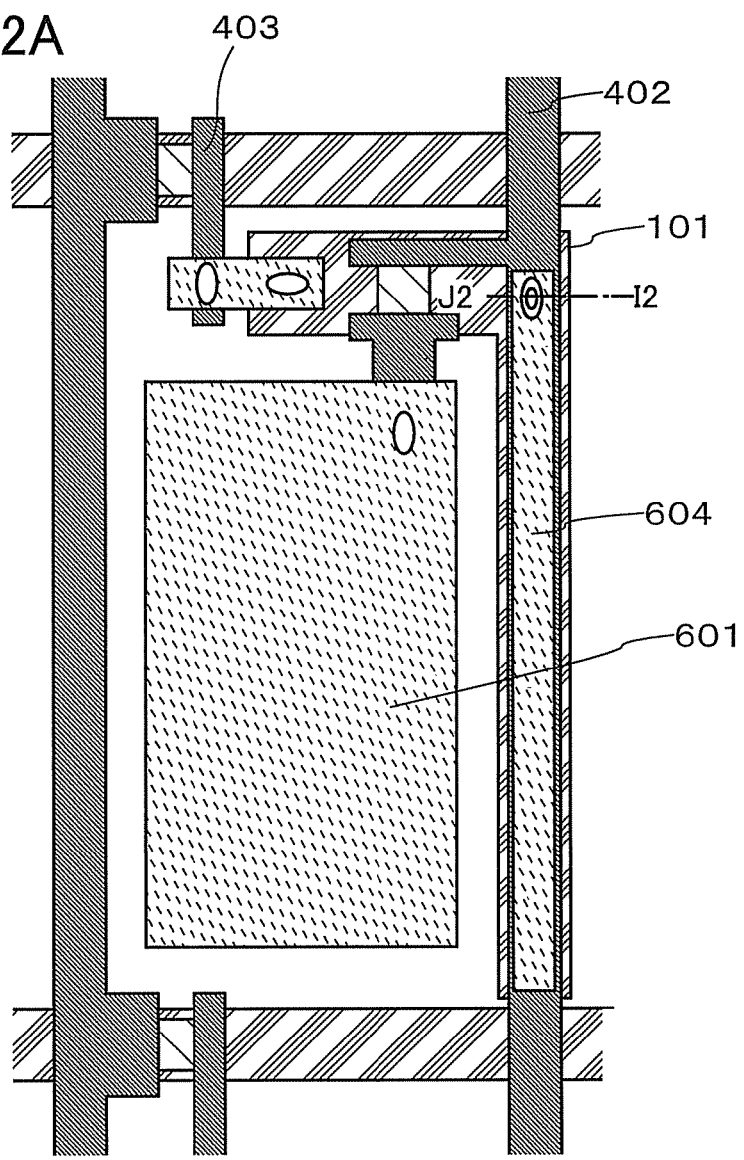
FIGS. 12A and 12B illustrate an example of a light-emitting device.
Figure 12B:
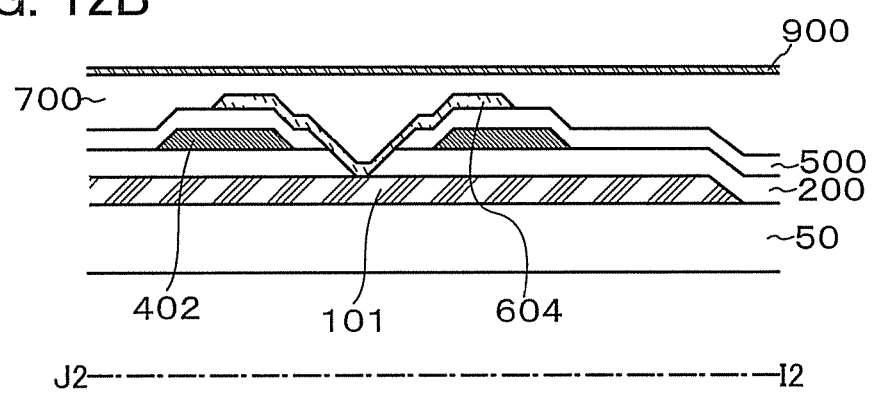

A structure in which the capacity of the capacitor is increased is illustrated in FIGS. 12A and 12B.

A structure in FIG. 12A is different from that in FIG. 9 in that the conductive layer 604 is provided.

FIG. 12B corresponds to a cross-sectional view taken along line I2-J2 in FIG. 12A.

Note that the circuit diagram in FIG. 8 also applies to the pixel circuit in FIGS. 12A and 12B.

The conductive layer 604 forms part of the one electrode of the capacitor C.

The conductive layer 604 and the conductive layer 601 that is the pixel electrode are preferably formed in the same step, which prevents an increase in the number of steps.

The conductive layer 604 is electrically connected to the conductive layer 101 through a contact hole provided in the insulating layer 200 and the insulating layer 500.

Here, in FIGS. 12A and 12B, the conductive layer 402 (wiring V (power supply line)) is provided with an opening portion.

A periphery of the contact hole provided in the insulating layer 200 and the insulating layer 500 in FIGS. 12A and 12B is located inside a periphery of the opening portion provided in the conductive layer 402 (wiring V (power supply line)).

That is, the conductive layer 604 and the conductive layer 101 are electrically connected to each other inside the opening portion provided in the conductive layer 402.

Note that it is preferable to provide a plurality of contact holes for a reduction of contact resistance between the conductive layer 604 and the conductive layer 101.

In the case where a plurality of contact holes are provided in the insulating layer 200 and the insulating layer 500, a plurality of opening portions corresponding to the plurality of contact holes are preferably provided in the conductive layer 402.

With the above structure, in which the other electrode of the capacitor C is interposed between the one electrodes of the capacitors, the capacity of the capacitor C can be increased.

Since the opening portion is provided in the conductive layer 402 (wiring V (power supply line)) in FIGS. 12A and 12B, the conductive layer 604 can be smaller than that in FIGS. 11A and 11B.

Therefore, an aperture ratio in FIGS. 12A and 12B can be larger than that in FIGS. 11A and 11B.

Further, since the conductive layer 604 is formed in a space in which the pixel electrode does not exist, the space in which the pixel electrode does not exist can be efficiently used.

Note that in FIGS. 12A and 12B, the conductive layer 403 and the conductive layer 101 may be in direct contact with each other.

Further, the light-emitting element in this embodiment may be substituted with another display element (e.g., a liquid crystal element or an electrophoretic element).

That is, this embodiment can be applied to general display devices.

Part or the whole of the structure described in this embodiment can be combined with part or the whole of a structure described in any of the other embodiments.

Embodiment 10

In the case where an inverted-staggered TFT is used, it is preferable that an auxiliary wiring (auxiliary electrode) for the second electrode (the counter electrode or the upper electrode) of the light-emitting element be provided.

Figure 13A:
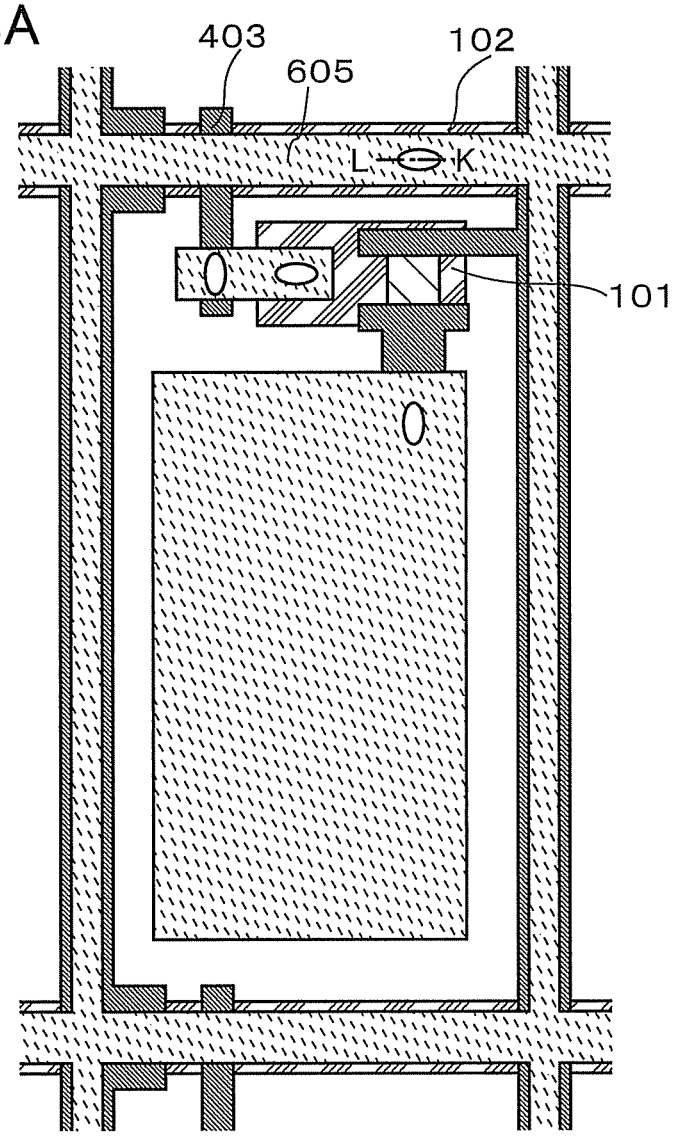
FIGS. 13A and 13B illustrate an example of a light-emitting device.
Figure 13B:
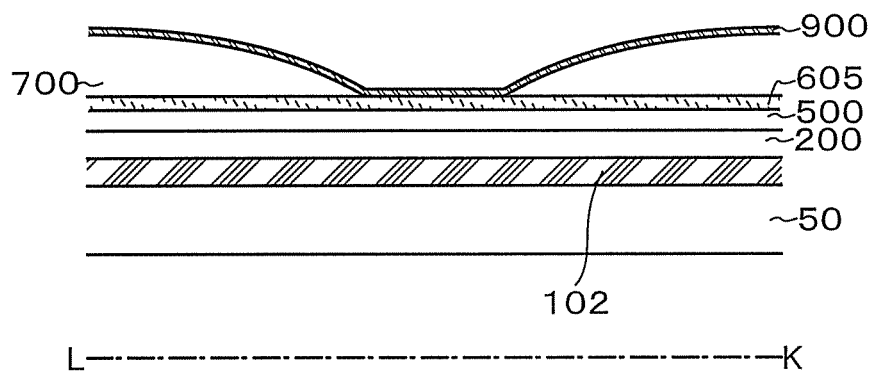

For example, a structure in FIGS. 13A and 13B is different from that in FIG. 6 in that a conductive layer 605 is provided.

FIG. 13B corresponds to a cross-sectional view taken along line K-L in FIG. 13A.

The conductive layer 605 functions as an auxiliary wiring for the conductive layer 900 serving as the second electrode of the light-emitting element.

The conductive layer 605 is electrically connected to the conductive layer 900 through an opening portion (contact hole) provided in the insulating layer 700.

Note that the shape of the conductive layer 605 in FIGS. 13A and 13B is a shape having a plurality of opening portions (a lattice-like or net-like shape).

Although a structure in which one pixel electrode is placed in one opening portion is illustrated in FIGS. 13A and 13B, a plurality of pixel electrodes may be placed in one opening portion.

Further, when a planarization film is used as the insulating layer 700, the possibility of disconnection of the conductive layer 900 can be lowered since the opening portion (contact hole) in the insulating layer 700 is formed so as to overlap with the conductive layer 102 (wiring G (gate line)).

In addition, the possibility of disconnection of the conductive layer 900 can be lowered when the dummy semiconductor layer (the electrically isolated semiconductor layer or floating semiconductor layer) formed in the same step as the semiconductor layer for the transistor is placed so as to overlap with the opening portion (contact hole) provided in the insulating layer 700.

Further, since the conductive layer 605 is formed in a space in which the pixel electrode does not exist, the space in which the pixel electrode does not exist can be efficiently used.

Note that in FIGS. 13A and 13B, the conductive layer 403 and the conductive layer 101 may be in direct contact with each other.

Part or the whole of the structure described in this embodiment can be combined with part or the whole of a structure described in any of the other embodiments.

Embodiment 11

Figure 14A:
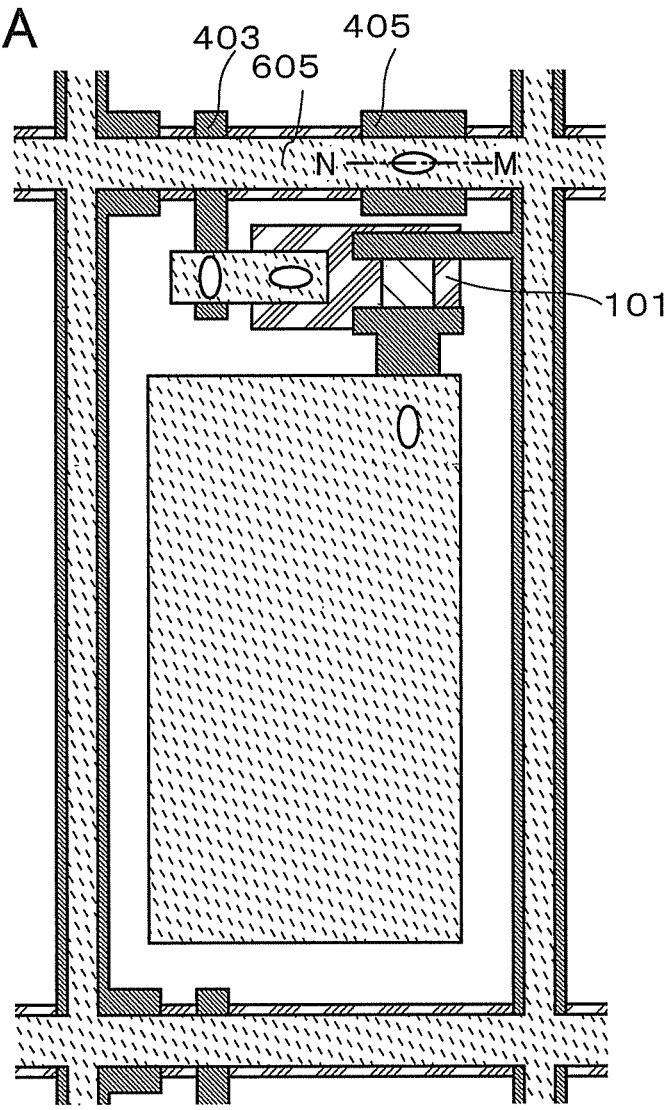
FIGS. 14A and 14B illustrate an example of a light-emitting device.
Figure 14B:
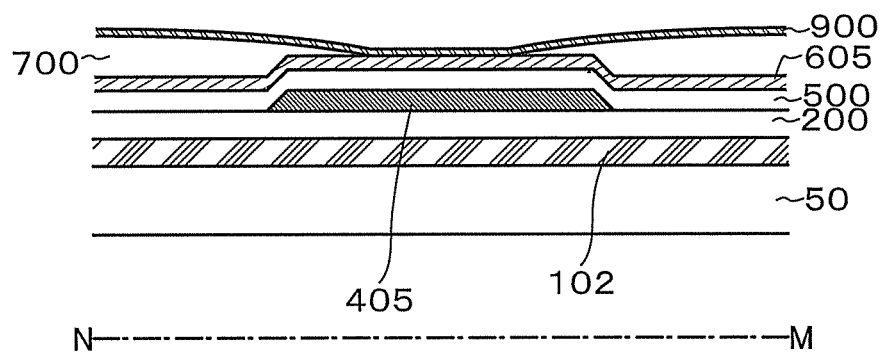

FIGS. 14A and 14B illustrate a structure in which a conductive layer 405 is placed so as to overlap with the opening portion (contact hole) provided, in the insulating layer 700 in FIGS. 13A and 13B.

The conductive layer 405 is a dummy electrode (an electrically isolated electrode or a floating electrode).

The conductive layer 405 is preferably formed in the same step as the source electrode and the drain electrode for the transistor, which prevents an increase in the number of steps.

By providing the conductive layer 405, the possibility of disconnection of the conductive layer 900 can be lowered.

In addition, the possibility of disconnection of the conductive layer 900 can be lowered when the dummy semiconductor layer (the electrically isolated semiconductor layer or floating semiconductor layer) formed in the same step as the semiconductor layer for the transistor is placed so as to overlap with the opening portion (contact hole) provided in the insulating layer 700.

Further, since the conductive layer 605 is formed in a space in which the pixel electrode does not exist, the space in which the pixel electrode does not exist can be efficiently used.

Note that in FIGS. 14A and 14B, the conductive layer 403 and the conductive layer 101 may be in direct contact with each other.

Part or the whole of the structure described in this embodiment can be combined with part or the whole of a structure described in any of the other embodiments.

Embodiment 12

Figure 16:
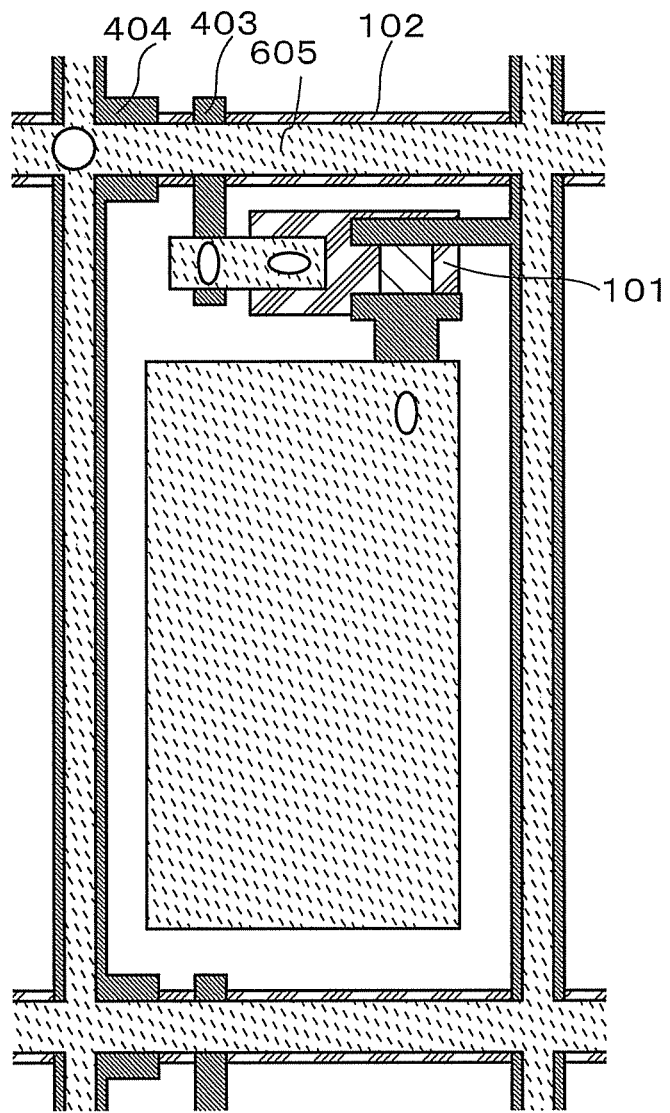
FIG. 16 illustrates an example of a light-emitting device.

FIG. 15 and FIG. 16 each illustrate a structure in which the opening portion (contact hole) in the insulating layer 700 in FIGS. 13A and 13B is placed in an intersection of wirings.

FIG. 15 illustrates a structure in which the opening portion (contact hole) is provided in an intersection portion of the conductive layer 102 corresponding to the wiring G (gate line) and the conductive layer 402 corresponding to the wiring V (power supply line).

FIG. 16 illustrates a structure in which the opening portion (contact hole) is provided in an intersection portion of the conductive layer 102 corresponding to the wiring G (gate line) and the conductive layer 404 corresponding to the wiring S (signal line).

In the structures in FIG. 15 and FIG. 16, the possibility of disconnection of the conductive layer 900 can be low as compared with that in the structure in FIGS. 13A and 13B.

In addition, the possibility of disconnection of the conductive layer 900 can be lowered when the dummy semiconductor layer (the electrically isolated semiconductor layer or floating semiconductor layer) formed in the same step as the semiconductor layer for the transistor is placed so as to overlap with the opening portion (contact hole) provided in the insulating layer 700.

Further, since the conductive layer 605 is formed in a space in which the pixel electrode does not exist, the space in which the pixel electrode does not exist can be efficiently used.

Note that in FIG. 15 and FIG. 16, the conductive layer 403 and the conductive layer 101 may be in direct contact with each other.

Part or the whole of the structure described in this embodiment can be combined with part or the whole of a structure described in any of the other embodiments.

Embodiment 13

FIGS. 17A and 17B and FIGS. 18A and 18B illustrate structures in each of which the opening portion (contact hole) provided in the insulating layer 700 in FIGS. 13A and 13B is placed so as to overlap with the conductive layer 404 (wiring).

In the case where a planarization film is used as the insulating layer 700, the possibility of disconnection of the conductive layer 900 can be lowered by placing the opening portion (contact hole) such that the opening portion overlaps with the conductive layer 404 (wiring).

Figure 17A:
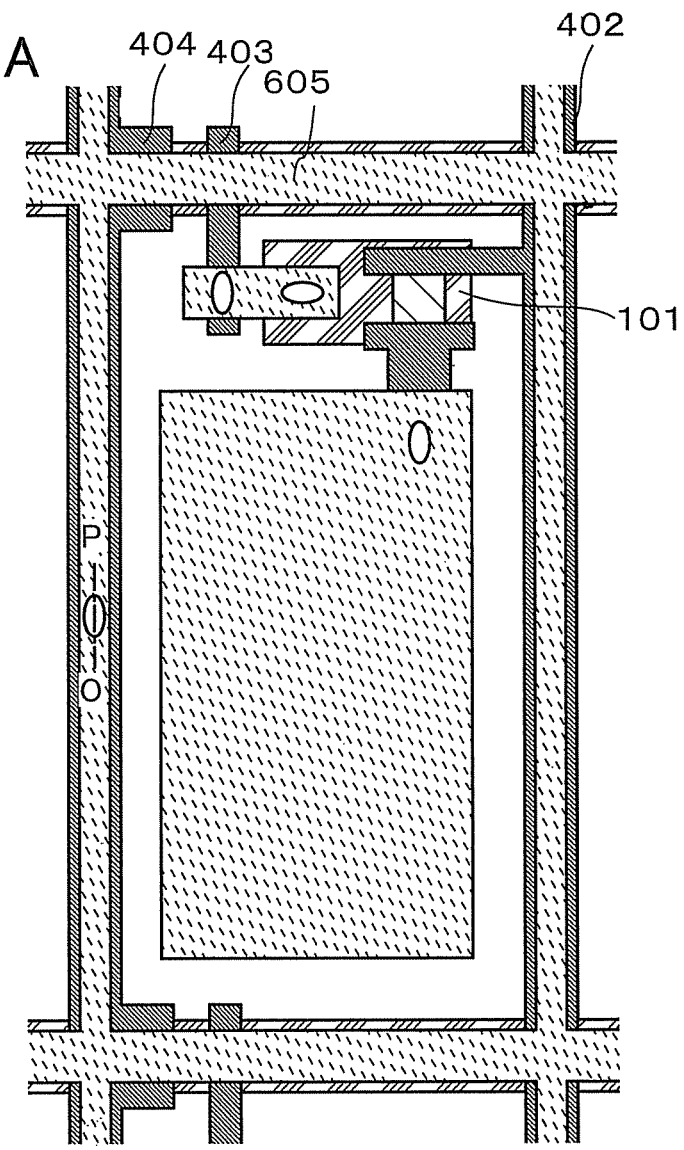
FIGS. 17A and 17B illustrate an example of a light-emitting device.
Figure 17B:
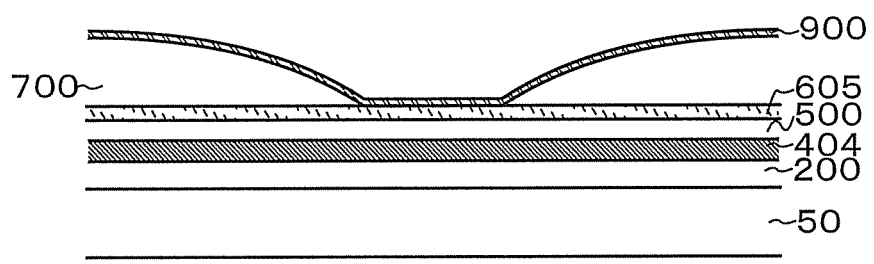
Figure 18A:
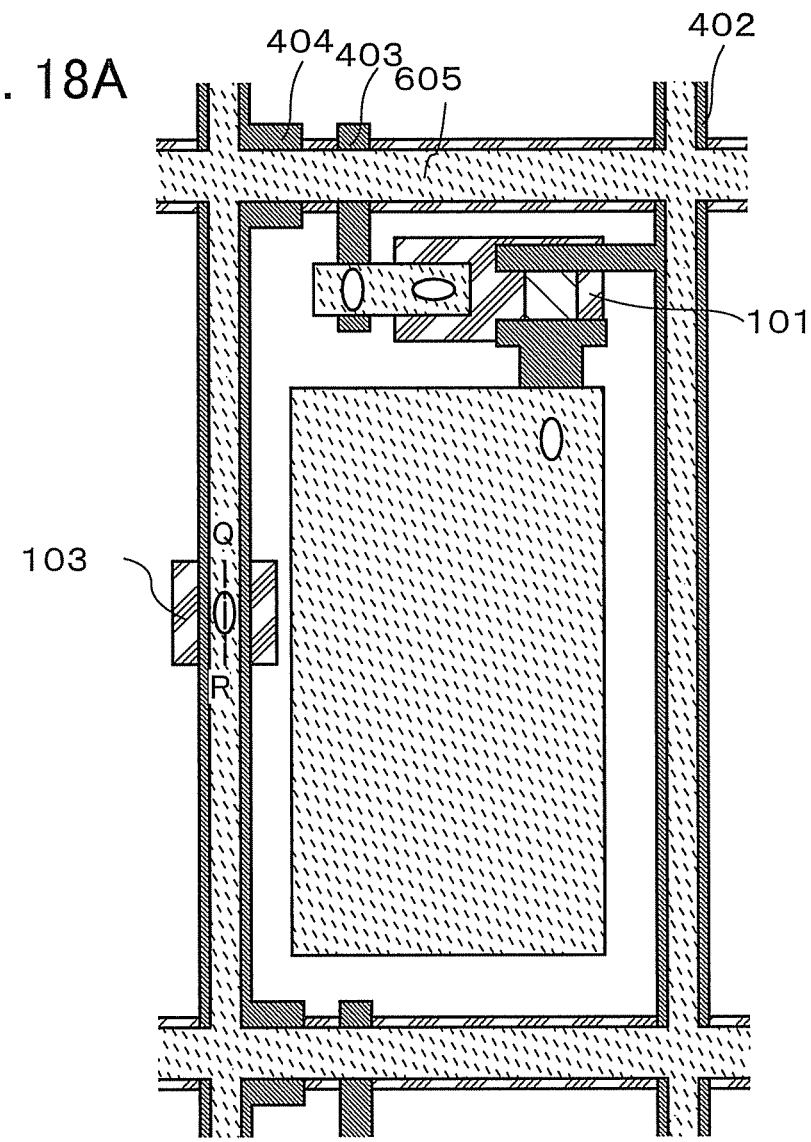
FIGS. 18A and 18B illustrate an example of a light-emitting device.
Figure 18B:
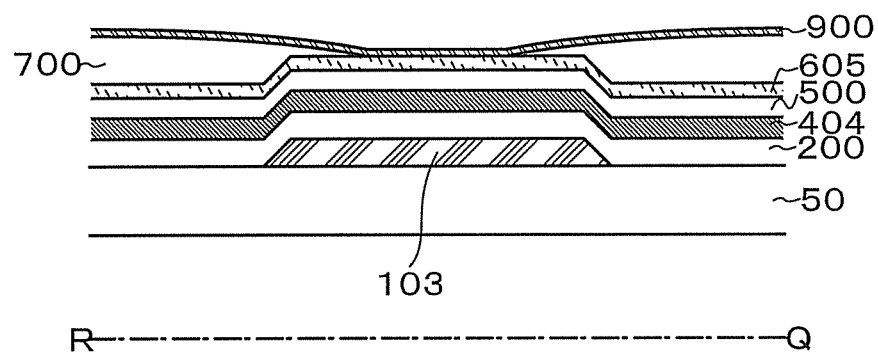

FIGS. 18A and 18B illustrate a structure in which a conductive layer 103 is placed so as to overlap with the opening portion (contact hole) provided in the insulating layer 700 in FIGS. 17A and 17B.

Note that FIG. 17B is a cross-sectional view taken along line O-P in FIG. 17A.

Note that FIG. 18B is a cross-sectional view taken along line Q-R in FIG. 18A.

The conductive layer 103 is a dummy electrode (an electrically isolated electrode or a floating electrode).

The conductive layer 103 is preferably formed in the same step as the gate electrode for the transistor, which prevents an increase in the number of steps.

By providing the conductive layer 103, the possibility of disconnection of the conductive layer 900 can be lowered.

In addition, the possibility of disconnection of the conductive layer 900 can be lowered when the dummy semiconductor layer (the electrically isolated semiconductor layer or floating semiconductor layer) formed in the same step as the semiconductor layer for the transistor is placed so as to overlap with the opening portion (contact hole) provided in the insulating layer 700.

Further, since the conductive layer 605 is formed in a space in which the pixel electrode does not exist, the space in which the pixel electrode does not exist can be efficiently used.

Note that in FIGS. 17A and 17B and FIGS. 18A and 18B, the conductive layer 403 and the conductive layer 101 may be in direct contact with each other.

Further, although the opening portion (contact hole) in the insulating layer 700 and the conductive layer 103 are placed so as to overlap with the conductive layer 404 in this embodiment, they may be placed so as to overlap with the conductive layer 402.

Part or the whole of the structure described in this embodiment can be combined with part or the whole of a structure described in any of the other embodiments.

Embodiment 14

Figure 19:
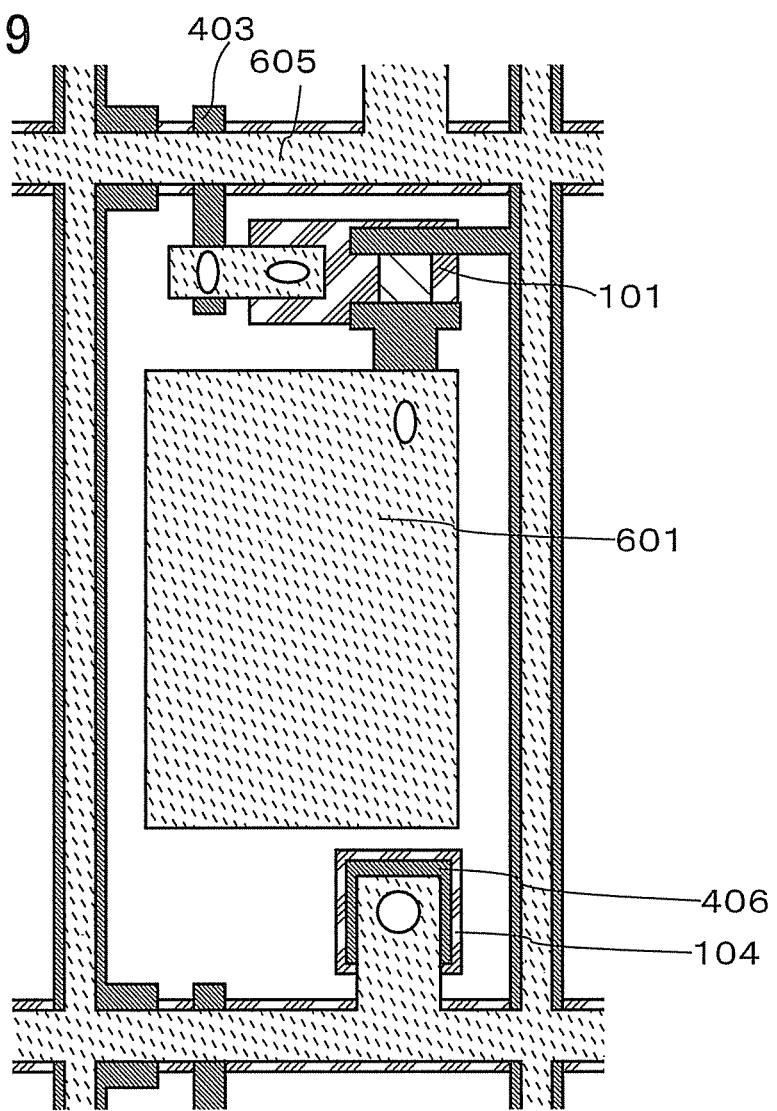
FIG. 19 illustrates an example of a light-emitting device.
Figure 20:
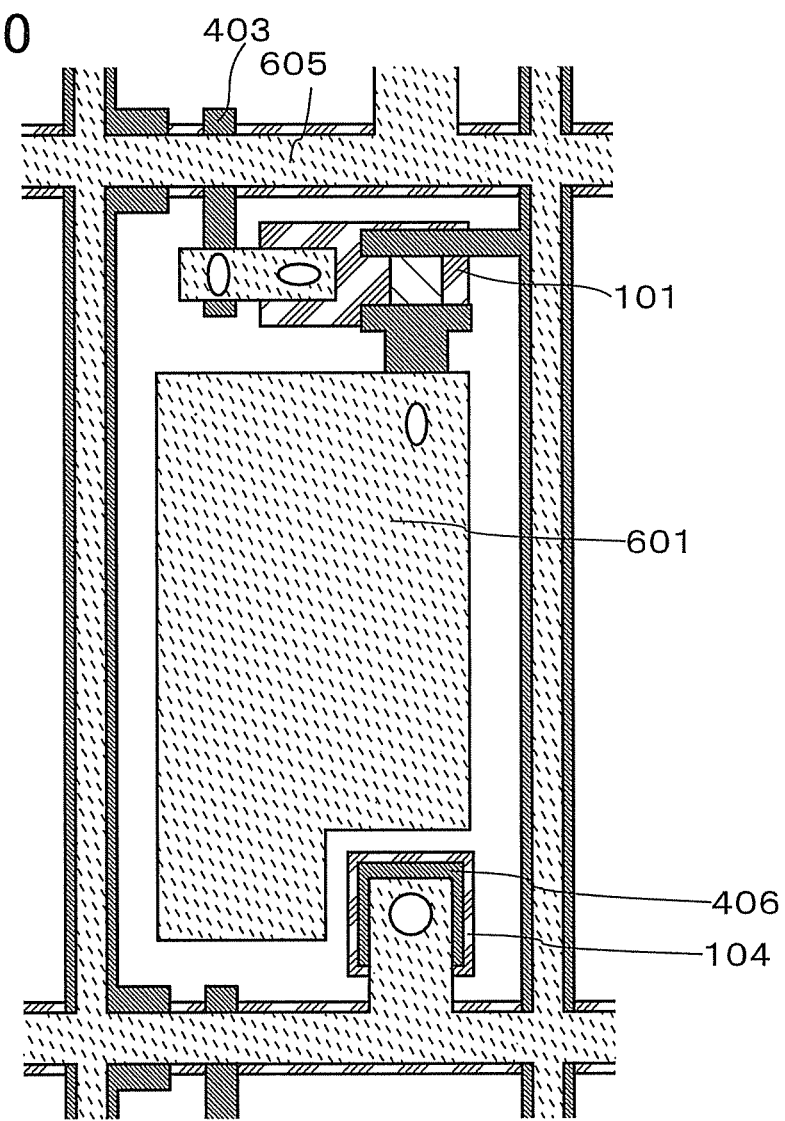
FIG. 20 illustrates an example of a light-emitting device.

FIG. 19 and FIG. 20 each illustrate a structure in which the opening portion (contact hole) provided in the insulating layer 700 in FIGS. 13A and 13B is placed so as to overlap with a conductive layer 104 and a conductive layer 406.

The conductive layer 104 is a dummy electrode (an electrically isolated electrode or a floating electrode).

The conductive layer 104 is preferably formed in the same step as the gate electrode for the transistor, which prevents an increase in the number of steps.

By providing the conductive layer 104, the possibility of disconnection of the conductive layer 900 can be lowered.

The conductive layer 406 is a dummy electrode (an electrically isolated electrode or a floating electrode).

The conductive layer 406 is preferably formed in the same step as the source electrode and the drain electrode for the transistor, which prevents an increase in the number of steps.

By providing the conductive layer 406, the possibility of disconnection of the conductive layer 900 can be lowered.

Although both the conductive layer 104 and the conductive layer 406 are formed in this embodiment, it is also possible to form either the conductive layer 104 or the conductive layer 406.

Note that when a notch is formed in the pixel electrode and the dummy electrode is provided in the notch as illustrated in FIG. 20, the area of the pixel electrode can be large as compared with that of the pixel electrode in FIG. 19, so that an aperture ratio can be increased.

In addition, the possibility of disconnection of the conductive layer 900 can be lowered when the dummy semiconductor layer (the electrically isolated semiconductor layer or floating semiconductor layer) formed in the same step as the semiconductor layer for the transistor is placed so as to overlap with the opening portion (contact hole) provided in the insulating layer 700.

Note that it is also possible that the dummy electrode is not provided and only the dummy semiconductor layer is formed.

Further, since the conductive layer 605 is formed in a space in which the pixel electrode does not exist, the space in which the pixel electrode does not exist can be efficiently used.

Note that in FIG. 19 and FIG. 20, the conductive layer 403 and the conductive layer 101 may be in direct contact with each other.

Part or the whole of the structure described in this embodiment can be combined with part or the whole of a structure described in any of the other embodiments.

Embodiment 15

The shape of the conductive layer 605 is not limited to a shape having a plurality of opening portions (a lattice-like or net-like shape) but can be variously changed.

Figure 21:
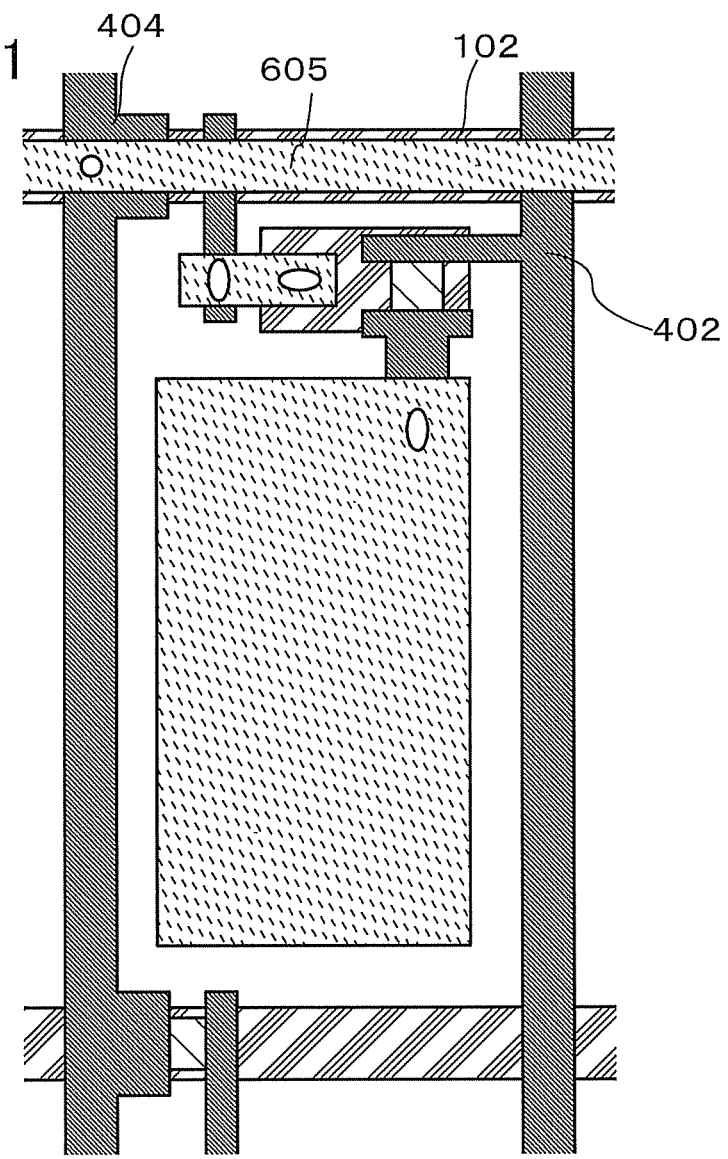
FIG. 21 illustrates an example of a light-emitting device.

For example, as illustrated in FIG. 21, a linear shape along the conductive layer 102 (wiring G (gate line)) may be employed.

Figure 22:
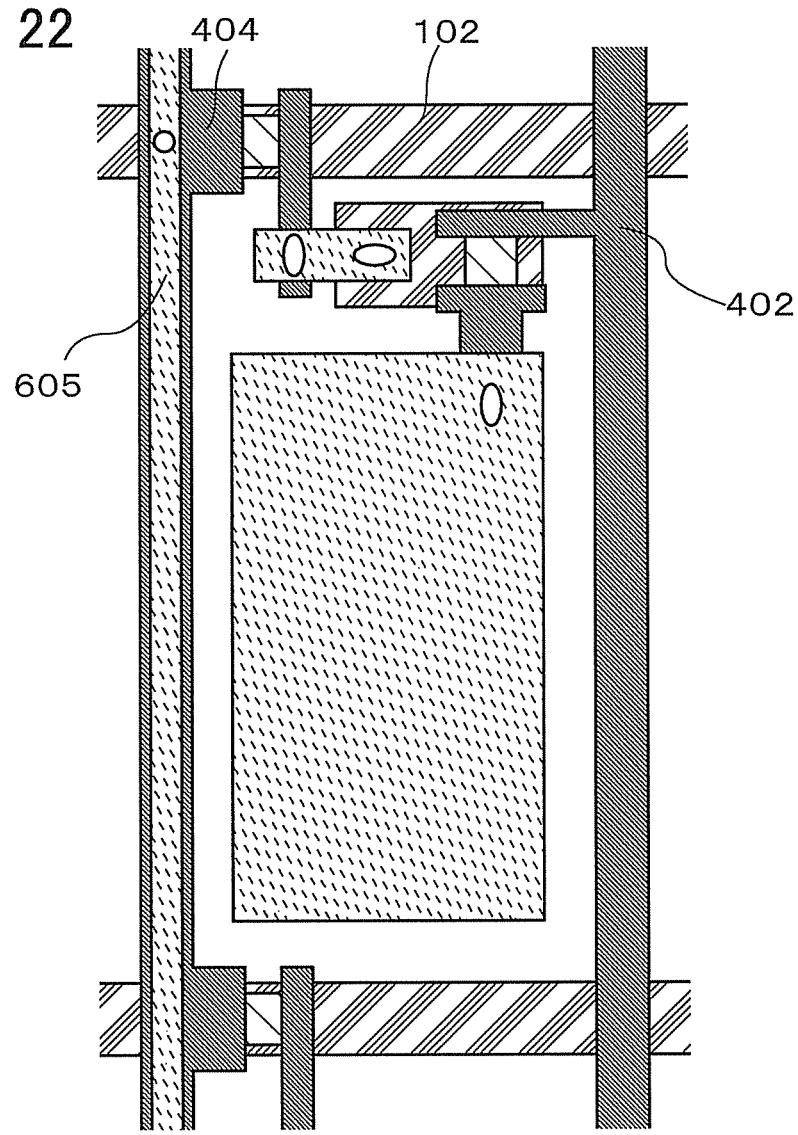
FIG. 22 illustrates an example of a light-emitting device.

For example, as illustrated in FIG. 22, a linear shape along the conductive layer 404 (wiring S (signal line)) may be employed.

It is needless to say that a linear shape along the conductive layer 402 (wiring V (power supply line)) may be employed.

A plurality of the conductive layers 605 may be provided.

Part or the whole of the structure described in this embodiment can be combined with part or the whole of a structure described in any of the other embodiments.

Embodiment 16

A plurality of opening portions (contact holes) are preferably provided in the insulating layer 700, in which case electrical connection between the conductive layer 605 and the conductive layer 900 can be more surely established.

In that case, the positions of the opening portions which are described in the other embodiments may be combined with each other (for example, a first opening portion is provided so as to overlap with the wiring G (gate line), and a second opening portion is provided so as to overlap with the wiring V (power supply line)).

Part or the whole of the structure described in this embodiment can be combined with part or the whole of a structure described in any of the other embodiments.

Embodiment 17

Any circuit can be applied to the pixel circuit of the light-emitting device.

Figure 23:
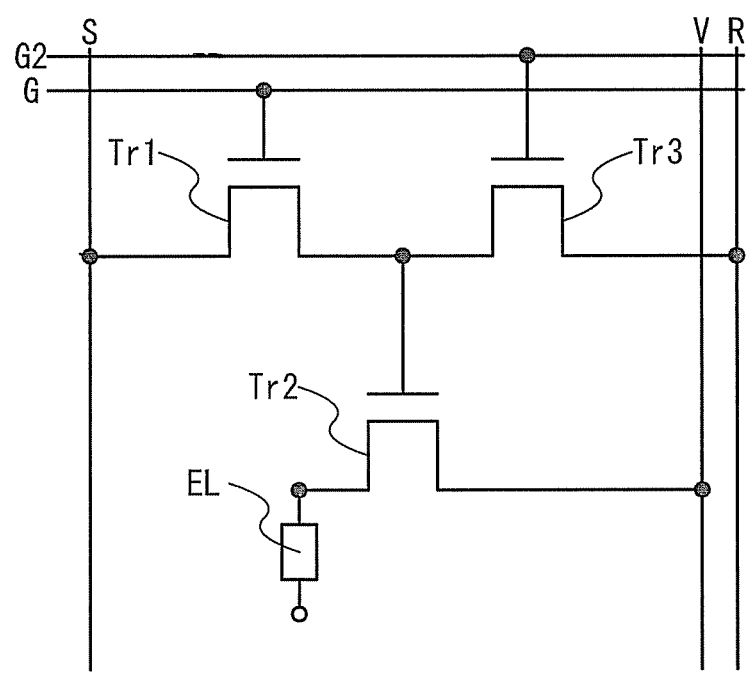
FIG. 23 illustrates an example of a light-emitting device.

An example of the pixel circuit of the light-emitting device is illustrated in FIG. 23.

A circuit in FIG. 23 is different from that in FIG. 5 in that a transistor Tr3, a wiring G2, and a wiring R are provided.

The transistor Tr3 is also referred to as a reset transistor or an erasing transistor.

The wiring G2 has the function of supplying a signal for controlling conduction and non-conduction of the transistor Tr3.

The wiring R corresponds to a reset line (erase line).

The reset line (erase line) has the function of supplying a signal for resetting voltage held in the pixel circuit.

A gate of the transistor Tr3 is electrically connected to the wiring G2.

One of a source and a drain of the transistor Tr3 is electrically connected to the wiring R.

The other of the source and the drain of the transistor Tr3 is electrically connected to the gate of the transistor Tr2.

Note that in FIG. 23, it is possible to make the wiring V double as the wiring R.

In other words, without providing the wiring R, one of the source and the drain of the transistor Tr3 may be electrically connected to the wiring V in FIG. 23.

Part or the whole of the structure described in this embodiment can be combined with part or the whole of a structure described in any of the other embodiments.

Embodiment 18

Any circuit can be applied to the pixel circuit of the light-emitting device.

Figure 24:
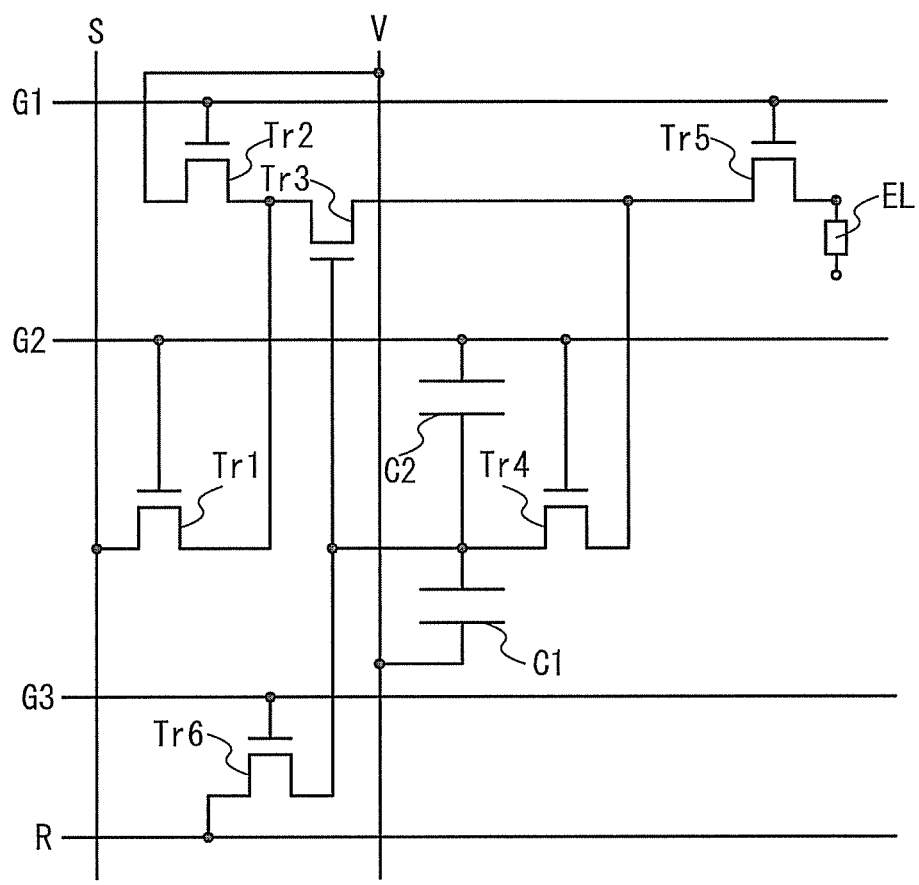
FIG. 24 illustrates an example of a light-emitting device.

An example of the pixel circuit of the light-emitting device is illustrated in FIG. 24.

The pixel circuit of the light-emitting device illustrated in FIG. 24 includes the transistors Tr1 to Tr6, the wiring S (signal line), wirings G1 to G3 (gate lines), the wiring R (reset line), the wiring V (power supply line), a capacitor C1, a capacitor C2, and the light-emitting element EL (EL element).

The transistors Tr1 to Tr6 may each independently be an n-channel transistor or a p-channel transistor.

The wiring S is electrically connected to one of the source and the drain of the transistor Tr1.

The wiring G1 is electrically connected to the gate of the transistor Tr2 and a gate of the transistor Tr5.

The wiring G2 is electrically connected to the gate of the transistor Tr1, a gate of the transistor Tr4, and one terminal (one electrode) of the capacitor C2.

The wiring G3 is electrically connected to a gate of the transistor Tr6.

The wiring R is electrically connected to one of a source and a drain of the transistor Tr6.

The wiring V is electrically connected to one of the source and the drain of the transistor Tr2 and one terminal (one electrode) of the capacitor C1.

The light-emitting element EL is electrically connected to one of a source and a drain of the transistor Tr5.

The other terminal (the other electrode) of the capacitor C1, the other of the source and the drain of the transistor Tr6, the gate of the transistor Tr3, one of a source and a drain of the transistor Tr4, and the other terminal (the other electrode) of the capacitor C2 are electrically connected to one another.

The other of the source and the drain of the transistor Tr1, the other of the source and the drain of the transistor Tr2, and one of the source and the drain of the transistor Tr3 are electrically connected to one another.

The other of the source and the drain of the transistor Tr3, the other of the source and the drain of the transistor Tr4, and the other of the source and the drain of the transistor Tr5 are electrically connected to one another.

The operation of the circuit in FIG. 24 will be described.

In the first period (reset period), the wiring G3 is selected and the transistor Tr6 is turned on, so that the pixel circuit is reset.

Note that the wiring G1 and the wiring G2 are not selected in the first period.

In the second period (write period), the wiring G2 is selected and the transistor Tr1 and the transistor Tr4 are turned on, so that a video signal is written from the wiring S.

Note that the wiring G1 and the wiring G3 are not selected in the second period.

In the third period (display period), the wiring G1 is selected and current is supplied from the wiring V to the light-emitting element EL through the transistor Tr2, the transistor Tr3, and the transistor Tr5.

Note that the wiring G2 and the wiring G3 are not selected in the third period.

In other words, operation of sequentially selecting the wiring G3, the wiring G2, and the wiring G1 is repeated.

Part or the whole of the structure described in this embodiment can be combined with part or the whole of a structure described in any of the other embodiments.

Embodiment 19

Any circuit can be applied to the pixel circuit of the light-emitting device.

Figure 25:
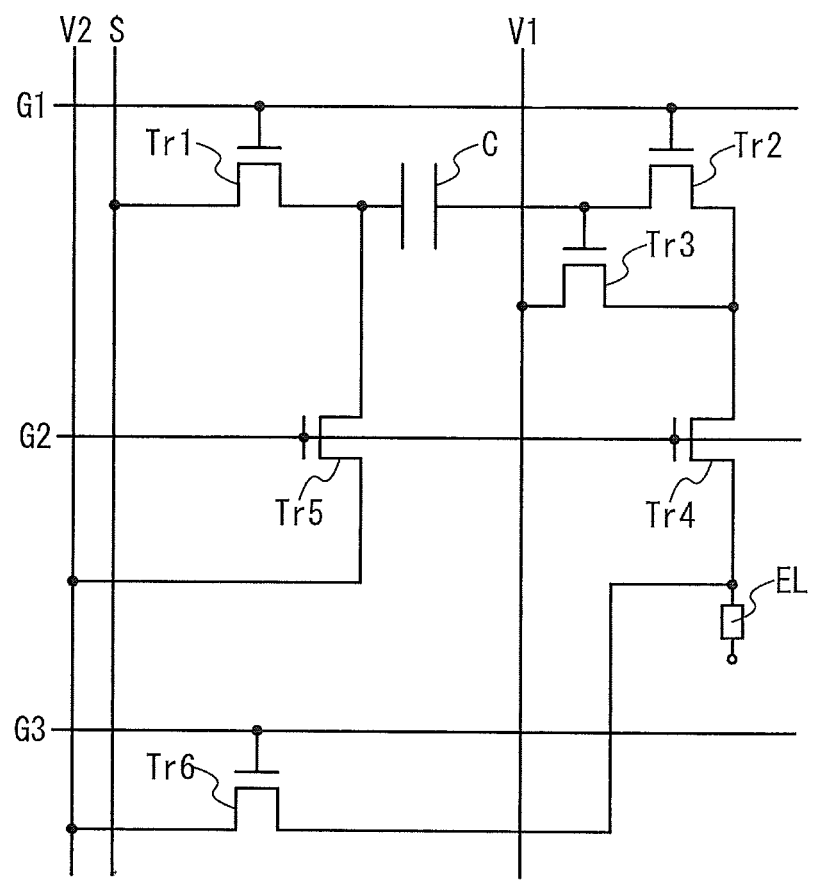
FIG. 25 illustrates an example of a light-emitting device.

An example of the pixel circuit of the light-emitting device is illustrated in FIG. 25.

The pixel circuit of the light-emitting device illustrated in FIG. 25 includes the transistors Tr1 to Tr6, the wiring S (signal line), the wirings G1 to G3 (gate lines), wirings V1 and V2 (power supply lines), the capacitor C, and the light-emitting element EL (EL element).

The wiring S is electrically connected to one of the source and the drain of the transistor Tr1.

The wiring G1 is electrically connected to the gate of the transistor Tr1 and the gate of the transistor Tr2.

The wiring G2 is electrically connected to the gate of the transistor Tr4 and the gate of the transistor Tr5.

The wiring G3 is electrically connected to the gate of the transistor Tr6.

The wiring V1 is electrically connected to one of the source and the drain of the transistor Tr3.

The wiring V2 is electrically connected to one of the source and the drain of the transistor Tr5 and one of the source and the drain of the transistor Tr6.

Note that when all of the transistors Tr1 to Tr6 are p-channel transistors, first voltage applied to the wiring V1 is set higher than second voltage applied to the wiring V2.

For example, the first voltage is set to Vdd (voltage higher than the reference potential) and the second voltage is set to Vss (voltage lower than the reference potential).

In contrast, when all of the transistors Tr1 to Tr6 are n-channel transistors, the first voltage applied to the wiring V1 is set lower than the second voltage applied to the wiring V2.

For example, the first voltage is set to Vss (voltage lower than the reference potential) and the second voltage is set to Vdd (voltage higher than the reference potential).

The light-emitting element EL is electrically connected to one of the source and the drain of the transistor Tr4 and the other of the source and the drain of the transistor Tr6.

The other of the source and the drain of the transistor Tr1, the other of the source and the drain of the transistor Tr5, and the one terminal (one electrode) of the capacitor C are electrically connected to one another.

One of the source and the drain of the transistor Tr2, the gate of the transistor Tr3, and the other terminal (the other electrode) of the capacitor C are electrically connected to one another.

The other of the source and the drain of the transistor Tr2, the other of the source and the drain of the transistor Tr3, and the other of the source and the drain of the transistor Tr4 are electrically connected to one another.

The operation of the circuit in FIG. 25 will be described.

In the first period, the wiring G1 and the wiring G3 are selected and the transistor Tr1, the transistor Tr2, and the transistor Tr6 are turned on.

Accordingly, it is preferable that the wiring G1 and the wiring G3 be electrically connected to each other.

Note that the wiring G2 is not selected in the first period.

In the second period, the wiring G2 is selected and the transistor Tr4 and the transistor Tr5 are turned on, so that display is performed.

Note that the wiring G1 and the wiring G3 are not selected in the second period.

When the above-described operation is performed, the following structure is preferably employed for simplification of the circuit.

The wiring G1 and the wiring G3 are electrically connected to a first terminal, and the wiring G2 is electrically connected to a second terminal.

Further, an input signal is input as it is to one of the first terminal and the second terminal, and a signal obtained by inverting an input signal is input to the other of the first terminal and the second terminal.

In that case, for simplification of the circuit, it is preferable that the input terminal for inputting an input signal and one of the first terminal and the second terminal be electrically connected to each other, and the input terminal and the other of the first terminal and the second terminal be electrically connected to each other through an inverter circuit.

Part or the whole of the structure described in this embodiment can be combined with part or the whole of a structure described in any of the other embodiments.

Embodiment 20

An example of a structure will be described in which a space in a region which is outside the pixel portion and in which the pixel electrode is not formed is efficiently used.

Figure 26:
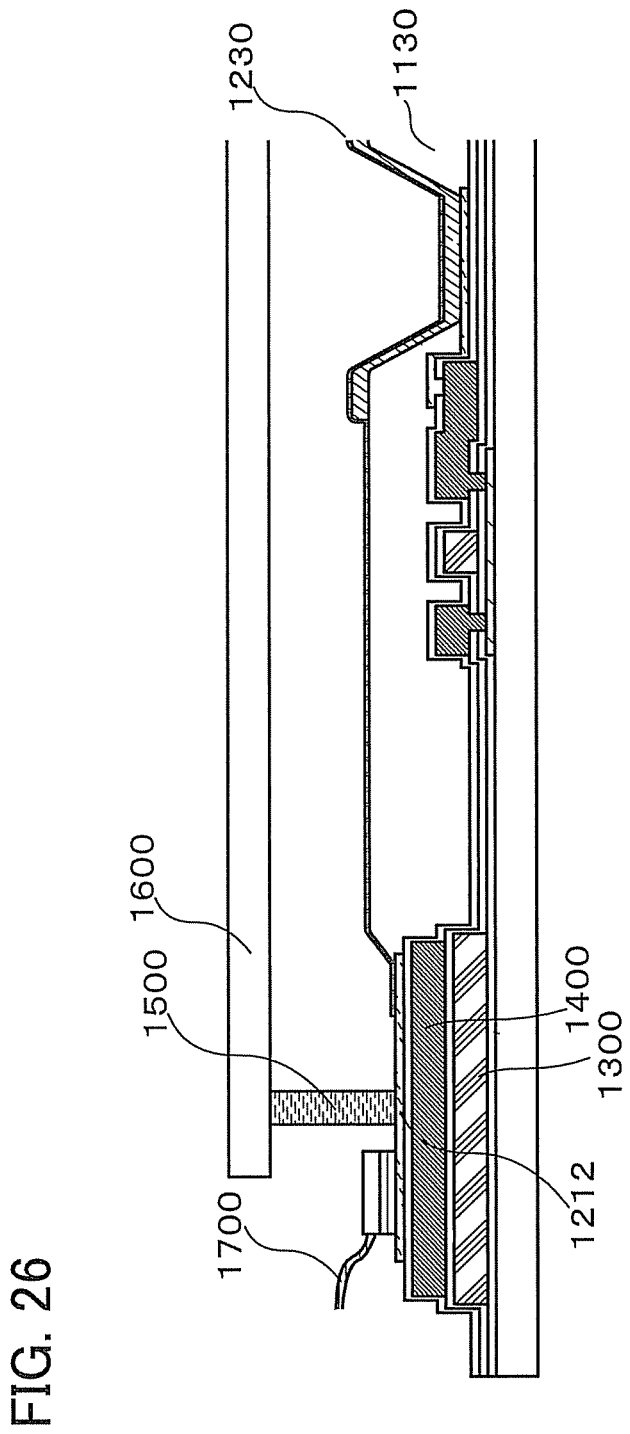
FIG. 26 illustrates an example of a light-emitting device.

FIG. 26 illustrates a modification example of the structure in FIG. 4.

In FIG. 26, the conductive layer 1212 is used as a connection wiring which connects an FPC (flexible printed circuit) 1700 and the conductive layer 1230.

In other words, current or voltage is supplied from the FPC 1700 to the conductive layer 1230 through the conductive layer 1212.

Further, the conductive layer 1212 and the conductive layer 1230 are electrically connected to each other at an end portion of the insulating layer 1130.

The end portion of the insulating layer 1130 is placed outside the pixel portion.

Note that it is also possible that an opening portion is provided outside the pixel portion so that the conductive layer 1212 and the conductive layer 1230 are electrically connected to each other through the opening portion outside the pixel portion.

Further, a sealant 1500 is placed between the end portion of the insulating layer 1130 and a mounting portion of the FPC 1700.

A sealed structure 1600 is provided over the sealant 1500.

As the sealant, a resin sealant, a glass frit, or the like can be used.

As the sealed structure, a substrate (e.g., a glass substrate, a metal substrate, or a plastic substrate), a sealing can, or the like can be used.

The conductive layer 1300 and the conductive layer 1400 are placed under the conductive layer 1212.

For a reduction in the number of steps, the conductive layer 1300 is preferably formed in the same step as the gate electrode of the transistor.

For a reduction in the number of steps, the conductive layer 1400 is preferably formed in the same step as the source electrode and the drain electrode of the transistor.

The conductive layer 1300 or the conductive layer 1400 is, for example, a wiring used for the light-emitting device, a dummy electrode (an electrically isolated electrode or a floating electrode), or the like.

The dummy electrode (the electrically isolated electrode or the floating electrode) is an electrode which is electrically separated from the wiring or electrode used for the light-emitting device.

In the case where the insulating layer 1130 is a planarization film, the possibility of disconnection of the conductive layer 1230 at the end portion of the insulating layer 1130 can be lowered by placing the conductive layer 1300 and the conductive layer 1400 such that the conductive layer 1300 and the conductive layer 1400 overlap with the end portion of the insulating layer 1130.

Further, when the conductive layer 1300, the conductive layer 1400, and the conductive layer 1212 overlap with one another in a region between the end portion of the insulating layer 1130 and the mounting portion of the FPC 1700, unevenness is not formed under the conductive layer 1212; therefore, disconnection of the conductive layer 1212 can be prevented.

Note that in FIG. 26, a dummy semiconductor layer (an electrically isolated semiconductor layer or a floating semiconductor layer) is preferably placed so as to overlap with the end portion of the insulating layer 1130, in which case the possibility of disconnection of the conductive layer 1230 can be further lowered.

The dummy semiconductor layer is preferably formed in the same step as the semiconductor layer of the transistor.

Part or the whole of the structure described in this embodiment can be combined with part or the whole of a structure described in any of the other embodiments.

Embodiment 21

Figure 27:
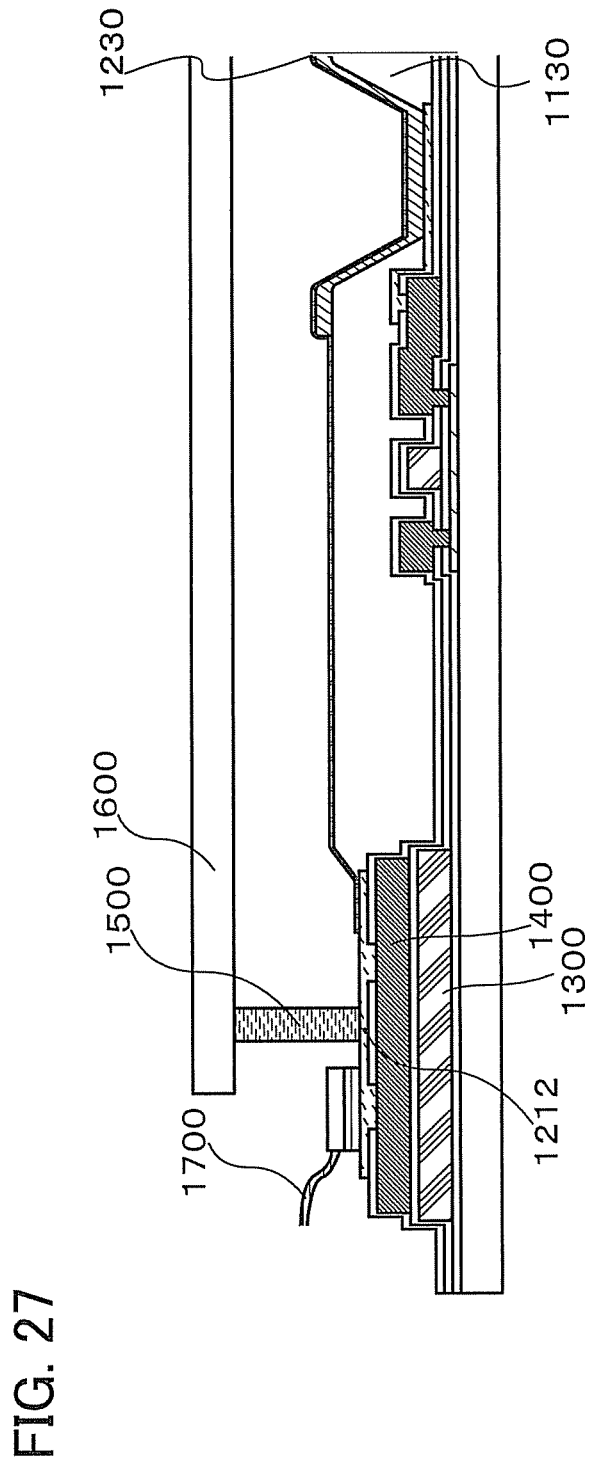
FIG. 27 illustrates an example of a light-emitting device.

FIG. 27 illustrates a structure in which the conductive layer 1212 and the conductive layer 1400 in FIG. 26 are electrically connected to each other through a contact hole.

Figure 28:
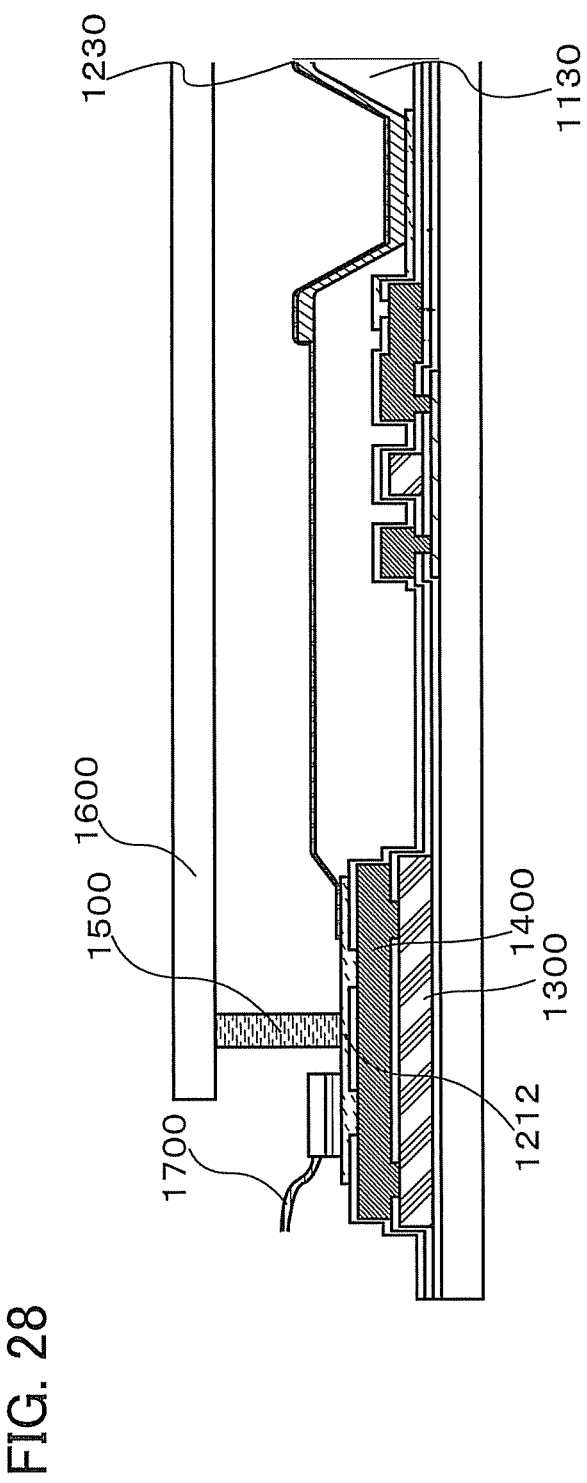
FIG. 28 illustrates an example of a light-emitting device.

FIG. 28 illustrates a structure in which the conductive layer 1300 and the conductive layer 1400 in FIG. 27 are electrically connected to each other through a contact hole.

With the structure illustrated in FIG. 27, the conductive layer 1400 can be used as an auxiliary wiring.

With the structure illustrated in FIG. 28, the conductive layer 1300 and the conductive layer 1400 can be used as auxiliary wirings.

Note that the contact hole is preferably provided near the end portion of the insulating layer 1130.

In other words, by making the end portion of the insulating layer 1130 and the contact hole close to each other, the distance in which only the conductive layer 1212 is used as a connection wiring becomes short; thus, resistance between the conductive layer 1230 and the FPC 1700 can be reduced.

Accordingly, one or more contact holes are preferably provided between the sealant 1500 and the end portion of the insulating layer 1130.

Further, the contact hole is preferably provided near the mounting portion of the FPC 1700.

In other words, by making the mounting portion of the FPC 1700 and the contact hole close to each other, the distance in which only the conductive layer 1212 is used as a wiring becomes short; thus, resistance between the conductive layer 1230 and the FPC 1700 can be reduced.

Accordingly, one or more contact holes are preferably provided so as to overlap with the mounting portion of the FPC 1700.

The FPC 1700 and the conductive layer 1212 are bonded to each other with the use of a resin containing conductive particles (e.g., an anisotropic conductive film) or the like.

Here, unevenness can be provided in the mounting portion of the FPC 1700 to ensure the bonding.

Therefore, also in view of ensure the bonding between the FPC 1700 and the conductive layer 1212, it is preferable that one or more contact holes be provided so as to overlap with the mounting portion of the FPC 1700.

In view of further ensure the bonding between the FPC 1700 and the conductive layer 1212, a plurality of contact holes are preferably provided so as to overlap with the mounting portion of the FPC 1700.

Part or the whole of the structure described in this embodiment can be combined with part or the whole of a structure described in any of the other embodiments.

Embodiment 22

A modification example of a contact structure in which a conductive layer under a partition layer and a conductive layer over the partition layer are electrically connected to each other will be described.

In FIGS. 29A to 29C and FIGS. 30A and 30B, a conductive layer 4002 is formed over a substrate 4001.

For a reduction in the number of steps, the conductive layer 4002 is preferably formed in the same step as a gate electrode of a transistor.

An insulating layer 4003 is formed over the conductive layer 4002.

A conductive layer 4004 is formed over the insulating layer 4003.

For a reduction in the number of steps, the conductive layer 4004 is preferably formed in the same step as a source electrode and a drain electrode of the transistor.

An insulating layer 4005 is formed over the conductive layer 4004.

A conductive layer 4006 is formed over the insulating layer 4005.

For a reduction in the number of steps, the conductive layer 4006 is preferably formed in the same step as a pixel electrode.

An insulating layer 4007 is formed over the conductive layer 4006.

The insulating layer 4007 corresponds to a partition layer and is formed using a planarization film.

A conductive layer 4008 is formed over the insulating layer 4007.

The conductive layer 4008 corresponds to an upper electrode of a light-emitting element.

An opening portion is provided in the insulating layer 4007.

The conductive layer 4002 and the conductive layer 4004 are placed so as to overlap with the opening portion provided in the insulating layer 4007, so that the possibility of disconnection of the conductive layer 4008 at the opening portion provided in the insulating layer 4007 is lowered.

Figure 29A:
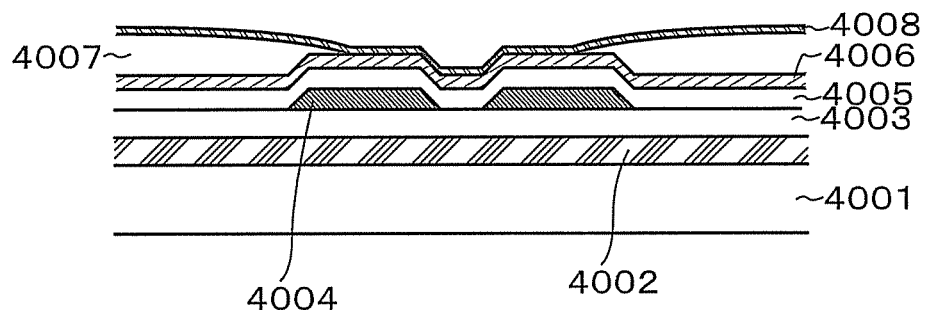
FIGS. 29A to 29C each illustrate an example of a light-emitting device.

Here, FIG. 29A illustrates an example in which an opening portion is provided in the conductive layer 4004.

The opening portion provided in the conductive layer 4004 is placed so as to overlap with the opening portion provided in the insulating layer 4007.

In FIG. 29A, the opening portion provided in the conductive layer 4004 is smaller than the opening portion provided in the insulating layer 4007 and a periphery of the opening portion provided in the conductive layer 4004 is located inside a periphery of the opening portion provided in the insulating layer 4007.

With the structure illustrated in FIG. 29A, unevenness is formed inside the opening portion provided in the insulating layer 4007; thus, the contact area between the conductive layer 4006 and the conductive layer 4008 can be large.

The large contact area between the conductive layer 4006 and the conductive layer 4008 leads to a reduction in contact resistance between the conductive layer 4006 and the conductive layer 4008.

Note that as long as unevenness is formed inside the opening portion provided in the insulating layer 4007, part of the periphery of the opening portion provided in the conductive layer 4004 may exist outside the periphery of the opening portion provided in the insulating layer 4007.

That is, the opening portion provided in the insulating layer 4007 at least includes a portion which overlaps with the periphery of the opening portion provided in the conductive layer 4004.

Figure 29B:
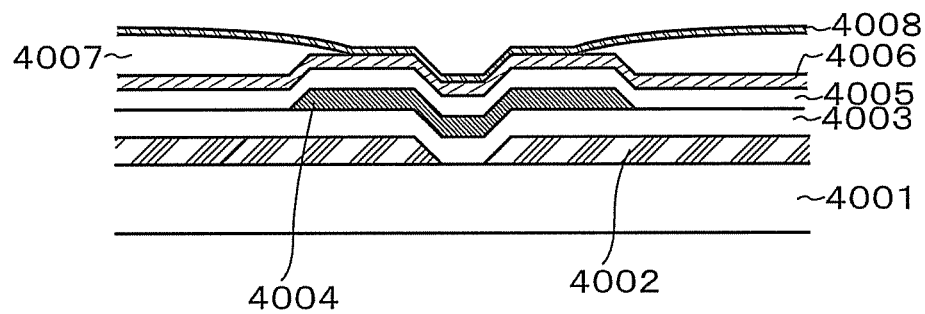

FIG. 29B illustrates an example in which an opening portion is provided in the conductive layer 4002.

The opening portion provided in the conductive layer 4002 is placed so as to overlap with the opening portion provided in the insulating layer 4007.

In FIG. 29B, the opening portion provided in the conductive layer 4002 is smaller than the opening portion provided in the insulating layer 4007 and a periphery of the opening portion provided in the conductive layer 4002 is located inside the periphery of the opening portion provided in the insulating layer 4007.

With the structure illustrated in FIG. 29B, unevenness is formed inside the opening portion provided in the insulating layer 4007; thus, the contact area between the conductive layer 4006 and the conductive layer 4008 can be large.

The large contact area between the conductive layer 4006 and the conductive layer 4008 leads to a reduction in contact resistance between the conductive layer 4006 and the conductive layer 4008.

Note that as long as unevenness is formed inside the opening portion provided in the insulating layer 4007, part of the periphery of the opening portion provided in the conductive layer 4002 may exist outside the periphery of the opening portion provided in the insulating layer 4007.

That is, the opening portion provided in the insulating layer 4007 at least includes a portion which overlaps with the periphery of the opening portion provided in the conductive layer 4002.

Figure 29C:
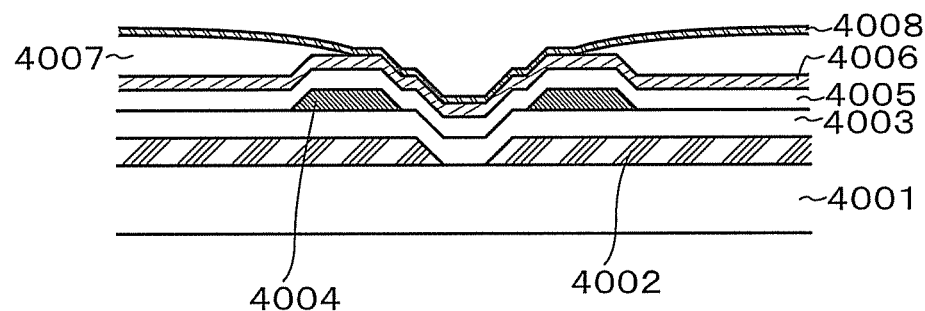

FIG. 29C illustrates an example in which opening portions are provided in the conductive layer 4002 and the conductive layer 4004.

The opening portions provided in the conductive layer 4002 and the conductive layer 4004 are placed so as to overlap with the opening portion provided in the insulating layer 4007.

In FIG. 29C, each of the opening portions provided in the conductive layer 4002 and the conductive layer 4004 is smaller than the opening portion provided in the insulating layer 4007 and the peripheries of the opening portions provided in the conductive layer 4002 and the conductive layer 4004 are located inside the periphery of the opening portion provided in the insulating layer 4007.

With the structure illustrated in FIG. 29C, unevenness is formed inside the opening portion provided in the insulating layer 4007; thus, the contact area between the conductive layer 4006 and the conductive layer 4008 can be large.

The large contact area between the conductive layer 4006 and the conductive layer 4008 leads to a reduction in contact resistance between the conductive layer 4006 and the conductive layer 4008.

Note that as long as unevenness is formed inside the opening portion provided in the insulating layer 4007, part of the peripheries of the opening portions provided in the conductive layer 4002 and the conductive layer 4004 may exist outside the periphery of the opening portion provided in the insulating layer 4007.

That is, the opening portion provided in the insulating layer 4007 at least includes a portion which overlaps with the peripheries of the opening portions provided in the conductive layer 4002 and the conductive layer 4004.

Note that in view of preventing disconnection of the conductive layer 4008, it is preferable that, as illustrated in FIG. 29C, the periphery of the opening portion provided in the conductive layer 4004 be located inside the periphery of the opening portion provided in the insulating layer 4007, and the periphery of the opening portion provided in the conductive layer 4002 be located inside the periphery of the opening portion provided in the conductive layer 4004.

That is, the opening portion provided in the insulating layer 4007 is made larger than the opening portion provided in the conductive layer 4004, and the opening portion provided in the conductive layer 4004 is made larger than the opening portion provided in the conductive layer 4002.

With the above structure, a step-like shape is formed, which can reduce the possibility of disconnection of the conductive layer 4008.

Figure 30A:
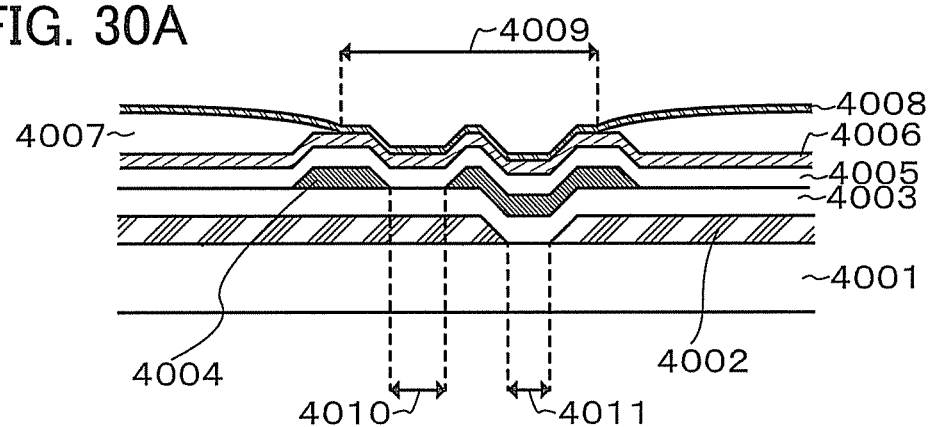
FIGS. 30A and 30B illustrate an example of a light-emitting device.

FIG. 30A illustrates a modification example of the structure in FIG. 29C.

In FIG. 30A, an opening portion 4009 is provided in the insulating layer 4007, an opening portion 4010 is provided in the conductive layer 4004, and an opening portion 4011 is provided in the conductive layer 4002.

The opening portion 4010 is placed such that part or the whole of the opening portion 4010 does not overlap with the opening portion 4011.

Since the number of the uneven portions can be increased with the structure in FIG. 30A, contact resistance can be small as compared with that in the structures in FIGS. 29A and 29B.

With the structure in FIG. 30A, a region in which the opening portion 4010 and the opening portion 4011 overlap with each other (a region with a deep groove) is not formed in the opening portion 4009, or the area of the region in which the opening portion 4010 and the opening portion 4011 overlap with each other (the region with a deep groove) in the opening portion 4009 can be small; thus, the possibility of disconnection of the conductive layer 4008 can be lowered.

The conductive layer 4002 or the conductive layer 4004 is, for example, a wiring used for the light-emitting device, a dummy electrode (an electrically isolated electrode or a floating electrode), or the like.

As the wiring used for the light-emitting device, for example, a gate wiring, a capacitor wiring, a signal line, a power supply line, an erase line, or the like can be used.

The dummy electrode (the electrically isolated electrode or the floating electrode) is an electrode which is electrically separated from the wiring or electrode used for the light-emitting device.

Note that a dummy semiconductor layer (an electrically isolated semiconductor layer or a floating semiconductor layer) is preferably placed so as to overlap with the opening portion provided in the insulating layer 4007, in which case the possibility of disconnection of the conductive layer 4008 can be further lowered.

The dummy semiconductor layer is preferably formed in the same step as a semiconductor layer of the transistor.

When the opening portion in the insulating layer 4007 is provided in an intersection portion of wirings (when both the conductive layer 4002 and the conductive layer 4004 are wirings), the structure in FIG. 30A is particularly preferable.

Figure 30B:
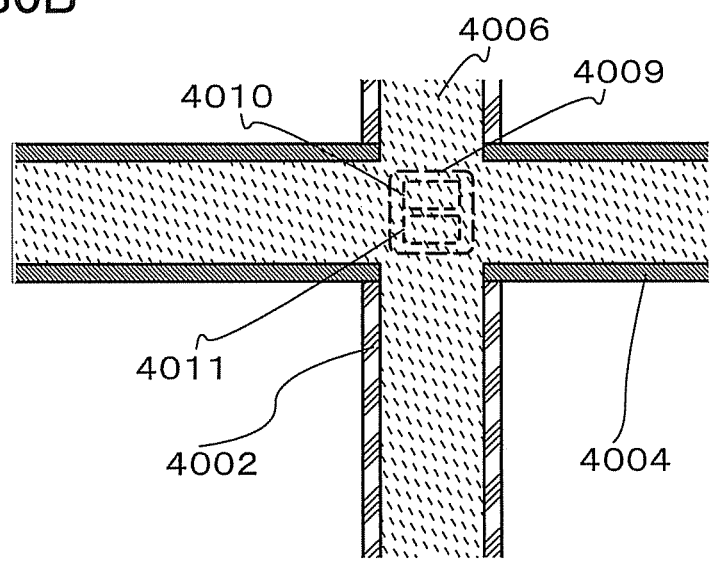

Here, FIG. 30B illustrates the case where the structure in FIG. 30A is employed when the opening portion in the insulating layer 4007 is provided in the intersection portion of the wirings.

Parasitic capacitance is formed in the intersection portion of the wirings, and specifically, parasitic capacitance is formed in a region where two wirings overlap with each other.

Thus, by placing the opening portion 4010 and the opening portion 4011 so that they are shifted from each other as illustrated in FIGS. 30A and 30B, the area of the region where the conductive layer 4002 (first wiring) and the conductive layer 4004 (second wiring) overlap with each other in the intersection portion is reduced.

Consequently, parasitic capacitance can be reduced in the intersection portion of the wirings.

Part or the whole of the structure described in this embodiment can be combined with part or the whole of a structure described in any of the other embodiments.

Embodiment 23

The technical idea of a reduction of parasitic capacitance in an intersection portion of wirings can be applied to general semiconductor devices.

A semiconductor device includes, in its category, general devices that have transistors, examples of which are light-emitting devices, liquid crystal display devices, memory devices, CPUs, and RFIDs.

Figure 31A:
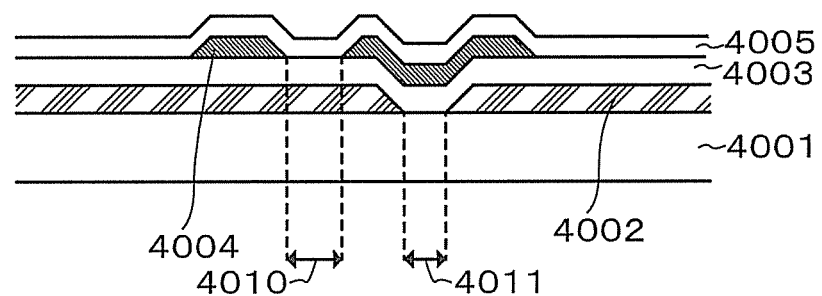
FIGS. 31A and 31B illustrate an example of a semiconductor device.
Figure 31B:
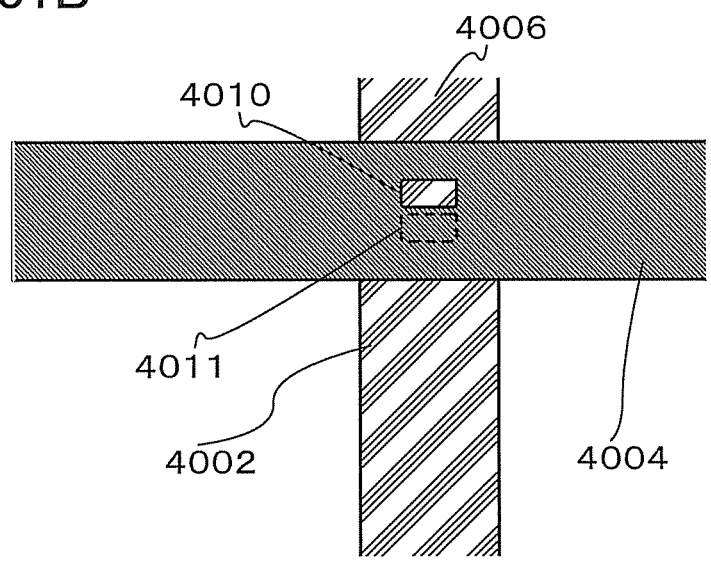

An example of a semiconductor device is illustrated in FIGS. 31A and 31B.

FIG. 31A is a cross-sectional view of an intersection portion of wirings, and FIG. 31B is a top view of the intersection portion of the wirings.

That is, the conductive layer 4002 is formed over the substrate 4001.

The conductive layer 4002 corresponds to the first wiring.

For a reduction in the number of steps, the conductive layer 4002 is preferably formed in the same step as a gate electrode of a transistor.

The insulating layer 4003 is formed over the conductive layer 4002.

The conductive layer 4004 is formed over the insulating layer 4003.

The conductive layer 4004 corresponds to the second wiring.

For a reduction in the number of steps, the conductive layer 4004 is preferably formed in the same step as a source electrode and a drain electrode of the transistor.

The insulating layer 4005 is formed over the conductive layer 4004.

Parasitic capacitance is formed in the intersection portion of the wirings, and specifically, parasitic capacitance is formed in a region where two wirings overlap with each other.

Thus, by placing the opening portion 4010 and the opening portion 4011 so that they are shifted from each other as illustrated in FIGS. 31A and 31B, the area of the region where the conductive layer 4002 (first wiring) and the conductive layer 4004 (second wiring) overlap with each other in the intersection portion is reduced.

Consequently, parasitic capacitance can be reduced in the intersection portion of the wirings.

Note that as long as the area of a region where the wirings overlap with each other is reduced, the intersection portion may have both the region where the opening portion 4010 and the opening portion 4011 overlap with each other and the region where the opening portion 4010 and the opening portion 4011 do not overlap with each other.

Figure 32A:
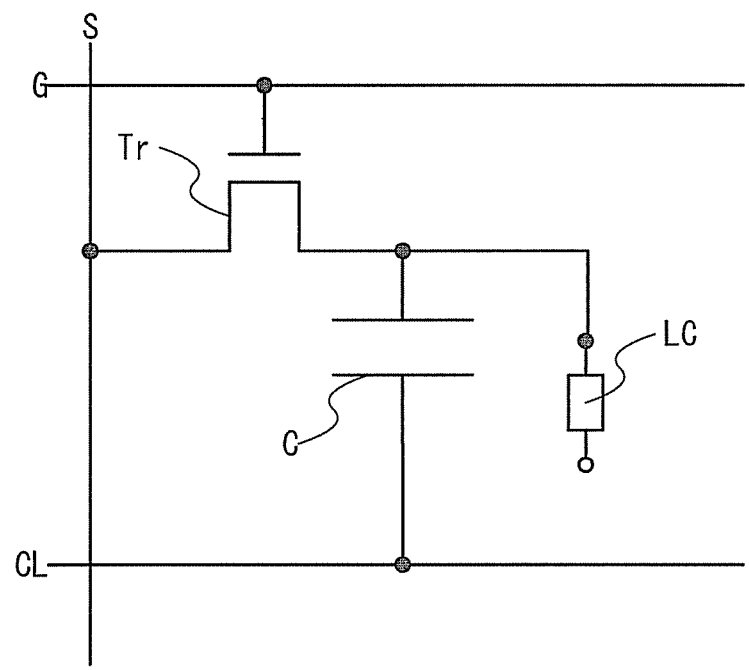
FIGS. 32A and 32B illustrate examples of semiconductor devices.
Figure 32B:
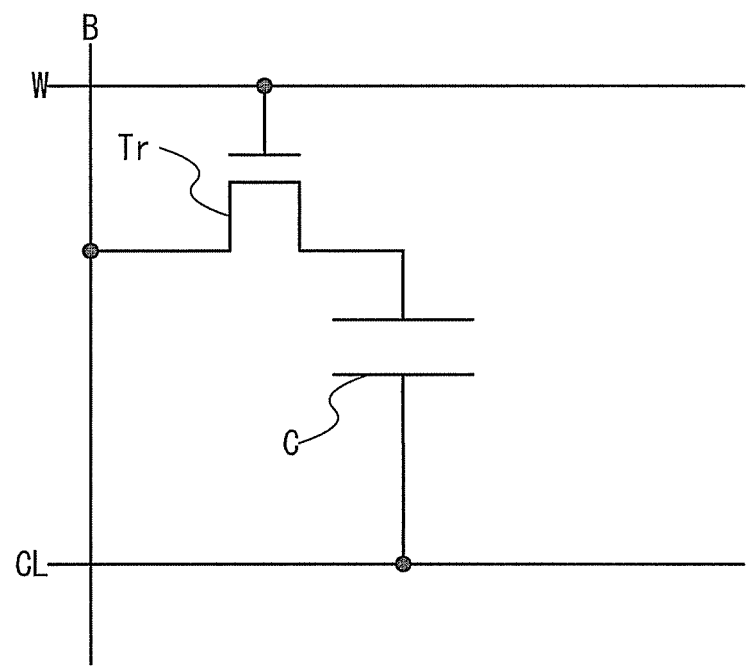

FIGS. 32A and 32B illustrate examples of semiconductor devices other than a light-emitting device.

FIG. 32A illustrates an example of a pixel circuit of a liquid crystal display device.

The circuit illustrated in FIG. 32A includes a transistor Tr, the capacitor C, a liquid crystal element LC, the wiring G (gate line), the wiring S (signal line), and a wiring CL (capacitor line).

The wiring G is electrically connected to a gate of the transistor Tr.

The wiring S is electrically connected to one of a source and a drain of the transistor Tr.

The wiring CL is electrically connected to one terminal (one electrode) of the capacitor C.

The other of the source and the drain of the transistor Tr, the other terminal (the other electrode) of the capacitor C, and the liquid crystal element LC are electrically connected to one another.

Here, a combination of two wirings in FIG. 32A to which the structure in FIGS. 31A and 31B can be applied is, for example, a combination of the wiring G and the wiring S, or a combination of the wiring G and the wiring CL.

For a reduction in the number of steps, the wiring S is preferably formed in the same step as a source electrode and a drain electrode of the transistor Tr.

Further, for a reduction in the number of steps, the wiring G and the wiring CL are preferably formed in the same step as a gate electrode of the transistor Tr.

FIG. 32B illustrates an example of a cell circuit of a memory device.

FIG. 32B illustrates an example of a DRAM.

The circuit illustrated in FIG. 32B includes the transistor Tr, the capacitor C, a wiring W (word line), a wiring B (bit line), and the wiring CL (capacitor line).

The wiring W is electrically connected to the gate of the transistor Tr.

The wiring B is electrically connected to one of the source and the drain of the transistor Tr.

The wiring CL is electrically connected to one terminal (one electrode) of the capacitor C.

The other of the source and the drain of the transistor Tr and the other terminal (the other electrode) of the capacitor C are electrically connected to each other.

Here, a combination of two wirings in FIG. 32B to which the structure in FIGS. 31A and 31B can be applied is, for example, a combination of the wiring G and the wiring S, or a combination of the wiring G and the wiring CL.

For a reduction in the number of steps, the wiring S is preferably formed in the same step as the source electrode and the drain electrode of the transistor Tr.

Further, for a reduction in the number of steps, the wiring G and the wiring CL are preferably formed in the same step as the gate electrode of the transistor Tr.

Examples of a structure based on FIGS. 31A and 31B and FIGS. 32A and 32B are as follows.

In Structure A, at least a transistor, a first wiring, and a second wiring are included.

The first wiring has a first opening portion and is electrically connected to a gate of the transistor.

The second wiring has a second opening portion and is electrically connected to one of a source and a drain of the transistor.

The second wiring is formed over or under the first wiring with an insulating layer provided therebetween and intersects with the first wiring.

The first opening portion and the second opening portion are placed so as to partly or completely overlap with the intersection portion of the first wiring and the second wiring. In other words, a periphery of the first opening portion and a periphery of the second opening portion may exist outside the intersection portion.

The intersection portion has a region in which the first opening portion and the second opening portion do not overlap with each other.

Note that for a reduction in parasitic capacitance, it is the most preferable that the first opening portion and the second opening portion do not overlap with each other in the intersection portion.

In Structure B, at least a transistor, a first wiring, a second wiring, a third wiring, and a capacitor are included.

The first wiring has a first opening portion and is electrically connected to a gate of the transistor.

The second wiring is electrically connected to one of a source and a drain of the transistor.

The third wiring has a third opening portion and is electrically connected to one terminal (one electrode) of the capacitor.

The other of the source and the drain of the transistor and the other terminal (the other electrode) of the capacitor are electrically connected to each other.

The third wiring is formed over or under the first wiring with an insulating layer provided therebetween and intersects with the first wiring.

The first opening portion and the third opening portion are placed so as to partly or completely overlap with the intersection portion of the first wiring and the third wiring. In other words, the periphery of the first opening portion and a periphery of the third opening portion may exist outside the intersection portion.

The intersection portion has a region in which the first opening portion and the third opening portion do not overlap with each other.

Note that for a reduction in parasitic capacitance, it is the most preferable that the first opening portion and the third opening portion do not overlap with each other in the intersection portion.

Note that Structure A and Structure B may be combined with each other.

To the transistors, capacitors, wirings, and the like described in this embodiment, the structures described in the other embodiments can be applied.

Part or the whole of the structure described in this embodiment can be combined with part or the whole of a structure described in any of the other embodiments.

Embodiment 24

Materials of the layers will be described.

A substrate can be, but not limited to, a glass substrate, a quartz substrate, a metal substrate (e.g., a stainless-steel substrate), a semiconductor substrate, or the like.

A base insulating film may be formed over the substrate.

An insulating layer can be formed using any material having an insulating property. For example, the insulating layer can be, but not limited to, an inorganic insulating film (e.g., a silicon oxide film, a silicon nitride film, a silicon oxide film containing nitrogen, a silicon nitride film containing oxygen, an aluminum nitride film, an aluminum oxide film, or a hafnium oxide film) or an organic insulating film (e.g., a polyimide film, an acrylic film, or a siloxane film). The insulating layer may have a single-layer structure or a stacked-layer structure.

Note that to prevent entry of impurities such as alkali metals used for a light-emitting element into a transistor, all of insulating layers (e.g., an interlayer insulating film and a gate insulating film) below a partition layer are preferably inorganic insulating films.

A conductive layer can be formed using any material having a conductive property. For example, the conductive layer can be, but not limited to, an aluminum film, a titanium film, a molybdenum film, a tungsten film, a gold film, a silver film, a copper film, a silicon film containing a donor element or an acceptor element, a film of any of a variety of alloys, or a transparent conductive film (e.g., an indium tin oxide film). The conductive layer may have a single-layer structure or a stacked-layer structure.

A semiconductor layer can be formed using any material which is a semiconductor. A semiconductor film containing silicon, an oxide semiconductor film, an organic semiconductor film, or the like can be used, but not limited thereto. The semiconductor layer may have a single-layer structure or a stacked-layer structure. Note that in the case of a TFT, a semiconductor film (island-shaped semiconductor film) isolated by element separation corresponds to the semiconductor layer. A transistor formed using an SOI substrate is included in the category of a TFT. Further, in the case of a transistor formed using a silicon wafer, the silicon wafer itself corresponds to the semiconductor layer.

A source region and a drain region in the semiconductor layer preferably contain a donor element or an acceptor element, in which case the resistance of the source region and the drain region can be reduced.

Silicon (Si), silicon germanium (SiGe), silicon carbide (SiC), or the like can be used for the semiconductor film containing silicon, but not limited thereto.

An oxide semiconductor preferably contains indium (In) or zinc (Zn). In particular, the oxide semiconductor preferably contains both In and Zn.

In addition, as a stabilizer for reducing variation in electrical characteristics of a transistor including the oxide semiconductor, it is preferable that one or more elements selected from gallium (Ga), tin (Sn), hafnium (Hf), aluminum (Al), and lanthanoid be contained.

As lanthanoid, there are lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

For a single-component metal oxide semiconductor, for example, an indium oxide, a tin oxide, a zinc oxide, or the like can be used.

For a two-component metal oxide semiconductor, for example, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, or the like can be used.

For a three-component metal oxide semiconductor, for example, an In—Ga—Zn-based oxide (also referred to as IGZO), an In—Sn—Zn-based oxide, a Sn—Ga—Zn-based oxide, an In—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an Al—Ga—Zn-based oxide, a Sn—Al—Zn-based oxide, or the like can be used.

For a four-component metal oxide semiconductor, for example, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, or the like can be used.

Note that here for example, an In—Ga—Zn-based oxide refers to an oxide containing In, Ga, and Zn, and there is no limitation on the ratio of In:Ga:Zn. The In—Ga—Zn-based oxide may contain a metal element other than In, Ga, and Zn.

For example, it is possible to use an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions.

Alternatively, it is possible to use an In—Sn—Zn-based oxide with an atomic ratio of In:Sn:Zn=1:1:1 (=1/3:1/3:1/3), In:Sn:Zn=2:1:3 (=1/3:1/6 1/2), or In:Sn:Zn=2:1:5 (=1/4:1/8: 5/8), or any of oxides whose composition is in the neighborhood of the above compositions.

However, the composition is not limited to those described above, and a material with an appropriate composition may be used depending on needed semiconductor characteristics (e.g., mobility, threshold voltage, and variations). In order to obtain the needed semiconductor characteristics, an oxide semiconductor preferably has appropriate carrier concentration, impurity concentration, defect density, atomic ratio between a metal element and oxygen, interatomic distance, density, and the like.

The semiconductor layer may be either single crystal or non-single-crystal.

In the case where the semiconductor layer is non-single-crystal, the semiconductor layer may be either amorphous or polycrystalline. Further, the semiconductor layer may have a structure including a crystalline portion in an amorphous portion. Note that a non-amorphous structure is preferred since an amorphous structure has many defects.

Note that in the case where an inverted-staggered transistor is formed, impurity semiconductor layers (buffer layers) containing a donor element or an acceptor element may be provided between the semiconductor layer and a source electrode and between the semiconductor layer and a drain electrode.

Note that a donor element for a semiconductor containing silicon is phosphorus or the like, and an acceptor element for a semiconductor containing silicon is boron or the like.

In the case where an organic EL element is formed, an electroluminescent layer has a light-emitting unit which includes at least a light-emitting layer containing an organic compound.

When an organic EL element is formed, the light-emitting unit may include an electron-injection layer, an electron-transport layer, a hole-injection layer, a hole-transport layer, or the like in addition to the light-emitting layer.

Further, when an organic EL element is formed, a structure in which a plurality of light-emitting units and a plurality of charge generation layers partitioning the plurality of light-emitting units are provided is employed, whereby luminance can be improved.

For the charge generation layer, a metal, an oxide conductor, a stacked-layer structure of metal oxide and an organic compound, a mixture of metal oxide and an organic compound, or the like can be used.

For the charge generation layer, use of the stacked-layer structure of metal oxide and an organic compound, the mixture of metal oxide and an organic compound, or the like is preferred, because such materials allow hole injection in the direction of a cathode and electron injection in the direction of an anode upon application of voltage.

Examples of the metal oxide that is preferably used for the charge generation layer include an oxide of transition metal, such as a vanadium oxide, a niobium oxide, a tantalum oxide, a chromium oxide, a molybdenum oxide, a tungsten oxide, a manganese oxide, and a rhenium oxide.

As the organic compound used for the charge generation layer, an amine-based compound (an arylamine compound in particular), a carbazole derivative, aromatic hydrocarbon, Alq, or the like is preferably used, because these materials form a charge-transfer complex with an oxide of transition metal.

In the case where an inorganic EL element is formed, an electroluminescent layer has a light-emitting unit which includes at least a light-emitting layer containing an inorganic compound.

In addition, it is preferable that the light-emitting layer containing an inorganic compound be interposed between a pair of dielectric layers.

Part or the whole of the structure described in this embodiment can be combined with part or the whole of a structure described in any of the other embodiments.

Embodiment 25

An example of a method for manufacturing a light-emitting device which includes a top-gate TFT will be described.

First, a semiconductor film is formed over a substrate and is patterned to form a semiconductor layer having an island shape.

The semiconductor film may be formed after a base insulating film is formed on the substrate surface.

Further, at the time of patterning the semiconductor film, an island-shaped dummy semiconductor layer may be formed.

Next, a gate insulating film is formed over the semiconductor layer.

Then, a conductive film is formed over the gate insulating film and is patterned to form a gate electrode, a wiring, an island-shaped dummy electrode, and the like.

Note that patterning refers to, for example, a process in which a mask is formed over a predetermined film (starting film), the predetermined film (starting film) is processed into a predetermined shape with the use of the mask, and the mask is removed.

Then, a donor element or an acceptor element is added to the semiconductor layer if necessary.

Next, a first interlayer insulating film is formed over the gate electrode.

Then, a contact hole is formed in the first interlayer insulating film and the gate insulating film.

Then, a conductive film is formed over the first interlayer insulating film and is patterned to form a source electrode, a drain electrode, a wiring, an island-shaped dummy electrode, and the like.

Next, a second interlayer insulating film is formed over the source electrode and the drain electrode.

After that, a contact hole is formed in the second interlayer insulating film.

Then, a conductive film is formed over the second interlayer insulating film and is patterned to form a first electrode, an auxiliary wiring, and the like.

After that, a planarization film is formed over the first electrode and the auxiliary wiring.

Next, an opening portion is formed in the planarization film.

Note that when the planarization film is photosensitive, the planarization film can be exposed to light and developed to form the opening portion.

When the planarization film is not photosensitive, the opening portion can be formed by patterning.

Then, an electroluminescent layer is formed over the first electrode.

After that, a second electrode is formed over the electroluminescent layer, the planarization film, and the auxiliary wiring.

Note that when the electroluminescent layer and the second electrode are formed by an evaporation method, the electroluminescent layer and the second electrode each having a predetermined shape can be formed by using an evaporation mask.

Part or the whole of the structure described in this embodiment can be combined with part or the whole of a structure described in any of the other embodiments.

Embodiment 26

An example of a method for manufacturing a light-emitting device which includes a bottom-gate TFT will be described.

In this embodiment, an example of a light-emitting device which includes an inverted-staggered channel-etched TFT will be described.

First, a conductive film is formed over a substrate and is patterned to form a gate electrode, a wiring, an island-shaped dummy electrode, and the like.

The conductive film may be formed after a base insulating film is formed on the substrate surface.

Next, a gate insulating film is formed over the gate electrode.

When the conductive layer which is in the same layer as a source electrode and a drain electrode is directly connected to the conductive layer which is in the same layer as the gate electrode, a contact hole is formed in the gate insulating film.

In contrast, when a connection wiring is formed in the same step as a first electrode (pixel electrode), the step of forming the contact hole in the gate insulating film is not necessary.

Next, a semiconductor film is formed over the gate insulating film and is patterned to form a semiconductor layer having an island shape.

It is also possible that an impurity semiconductor film containing a donor element or an acceptor element is formed over the semiconductor film and the semiconductor film and the impurity semiconductor film are patterned, whereby an island-shaped semiconductor layer and an island-shaped impurity semiconductor layer are formed.

Further, at the time of patterning the semiconductor film, an island-shaped dummy semiconductor layer may be formed.

In addition, at the time of patterning the impurity semiconductor film, an island-shaped dummy impurity semiconductor layer may be formed.

Then, a conductive film is formed over the semiconductor layer and the gate insulating film and is patterned to form a source electrode, a drain electrode, a wiring, an island-shaped dummy electrode, and the like.

Note that in the case where the impurity semiconductor layer is formed, the impurity semiconductor layer between the source electrode and the drain electrode is removed by etching.

Further, by the step of patterning the conductive film or the step of removing the impurity semiconductor layer between the source electrode and the drain electrode by etching, a surface of the semiconductor layer between the source electrode and the drain electrode is etched.

Next, an interlayer insulating film is formed over the source electrode and the drain electrode.

After that, a first contact hole is formed in the interlayer insulating film, and a second contact hole is formed in the interlayer insulating film and the gate insulating film.

For a reduction in the number of steps, the first contact hole and the second contact hole are preferably formed at the same time.

Then, a conductive film is formed over the interlayer insulating film and is patterned to form the first electrode, a connection wiring, an auxiliary wiring, a capacitor electrode, and the like.

After that, a planarization film is formed over the first electrode and the auxiliary wiring.

Next, an opening portion is formed in the planarization film.

Note that when the planarization film is photosensitive, the planarization film can be exposed to light and developed to form the opening portion.

When the planarization film is not photosensitive, the opening portion can be formed by patterning.

Then, an electroluminescent layer is formed over the first electrode.

After that, a second electrode is formed over the electroluminescent layer, the planarization film, and the auxiliary wiring.

Note that when the electroluminescent layer and the second electrode are formed by an evaporation method, the electroluminescent layer and the second electrode each having a predetermined shape can be formed by using an evaporation mask.

Part or the whole of the structure described in this embodiment can be combined with part or the whole of a structure described in any of the other embodiments.

Embodiment 27

The light-emitting device or the semiconductor device described in the other embodiments can be mounted on a display portion of an electronic device, for example.

As an electronic device, there are a television, a computer, a camera, a phone (e.g., a land-line phone or a mobile phone), a portable terminal, and the like; however, one embodiment of the present invention is not limited thereto.

Part or the whole of the structure described in this embodiment can be combined with part or the whole of a structure described in any of the other embodiments.

This application is based on Japanese Patent Application serial no. 2012-010155 filed with Japan Patent Office on Jan. 20, 2012, the entire contents of which are hereby incorporated by reference.

What is claimed is:

1. A light-emitting device comprising:
a transistor and a first conductive layer;
an insulating layer over the transistor and the first conductive layer;
a first electrode and a second conductive layer over the insulating layer;
a planarization film over the first electrode, the planarization film comprising an opening portion;
an electroluminescent layer over the first electrode and the planarization film; and
a second electrode over the electroluminescent layer and the planarization film,
wherein the second electrode is electrically connected to the second conductive layer through the opening portion,
wherein the opening portion overlaps with the first conductive layer and the second conductive layer, and
wherein the first conductive layer is electrically floating.

2. The light-emitting device according to claim 1,
wherein the first conductive layer is in the same layer as a gate electrode of the transistor, and
wherein the second conductive layer is in the same layer as the first electrode.

3. The light-emitting device according to claim 1,
wherein the first conductive layer is in the same layer as a source electrode and a drain electrode of the transistor, and
wherein the second conductive layer is in the same layer as the first electrode.

4. A light-emitting device comprising:
a transistor, a first conductive layer, and a second conductive layer;
an insulating layer over the transistor, the first conductive layer, and the second conductive layer;
a first electrode and a third conductive layer over the insulating layer;
a planarization film over the first electrode, the planarization film comprising a first opening portion;
an electroluminescent layer over the first electrode and the planarization film; and
a second electrode over the electroluminescent layer and the planarization film,
wherein the second electrode is electrically connected to the third conductive layer through the first opening portion, and
wherein the opening portion overlaps with the first conductive layer, the second conductive layer, and the third conductive layer.

5. The light-emitting device according to claim 4,
wherein one of the first conductive layer and the second conductive layer is electrically floating, and
wherein the other of the first conductive layer and the second conductive layer is a wiring.

6. The light-emitting device according to claim 5,
wherein the wiring is any one of a gate wiring, a capacitor wiring, a signal line, a power supply line, and an erase line.

7. The light-emitting device according to claim 4,
wherein the first conductive layer and the second conductive layer are electrically floating.

8. The light-emitting device according to claim 4,
wherein one of the first conductive layer and the second conductive layer is a first wiring,
wherein the other of the first conductive layer and the second conductive layer is a second wiring, and
wherein the first opening portion is located in an intersection portion of the first wiring and the second wiring.

9. The light-emitting device according to claim 8,
wherein the first wiring and the second wiring are each any one of a gate wiring, a capacitor wiring, a signal line, a power supply line, and an erase line.

10. The light-emitting device according to claim 4,
wherein one of the first conductive layer and the second conductive layer comprises a second opening portion, and
wherein the first opening portion overlaps with a periphery of the second opening portion.

11. The light-emitting device according to claim 4,
wherein the first conductive layer comprises a second opening portion,
wherein the second conductive layer comprises a third opening portion, and
wherein the first opening portion overlaps with a periphery of the second opening portion and a periphery of the third opening portion.

12. The light-emitting device according to claim 4,
wherein the first conductive layer is in the same layer as a gate electrode of the transistor,
wherein the second conductive layer is in the same layer as source and drain electrodes of the transistor, and
wherein the third conductive layer is in the same layer as the first electrode.

13. A light-emitting device comprising:
a transistor and a first conductive layer;
a first insulating layer over the transistor and the first conductive layer;

a first electrode and a second conductive layer over the first insulating layer;
a second insulating layer over the first electrode;
an electroluminescent layer over the first electrode and the second insulating layer; and
a second electrode over the electroluminescent layer and the second insulating layer,
wherein the second electrode is electrically connected to the second conductive layer,
wherein the first conductive layer and the second conductive layer overlap each other at a portion where the second electrode is in contact with the second conductive layer, and
wherein the first conductive layer is electrically floating.

14. The light-emitting device according to claim 13,
wherein the first conductive layer is in the same layer as a source electrode and a drain electrode of the transistor, and
wherein the second conductive layer is in the same layer as the first electrode.

15. The light-emitting device according to claim 13,
wherein the first conductive layer is in the same layer as a gate electrode of the transistor, and
wherein the second conductive layer is in the same layer as the first electrode.

16. A light-emitting device comprising:
a transistor, a first conductive layer, and a second conductive layer;
a first insulating layer over the transistor, the first conductive layer, and the second conductive layer;
a first electrode and a third conductive layer over the first insulating layer;
a second insulating layer over the first electrode;
an electroluminescent layer over the first electrode and the second insulating layer; and
a second electrode over the electroluminescent layer and the second insulating layer,
wherein the second electrode is electrically connected to the third conductive layer, and
wherein the first conductive layer, the second conductive layer and the third conductive layer overlap one another at a portion where the second electrode is in contact with the third conductive layer.

17. The light-emitting device according to claim 16,
wherein one of the first conductive layer and the second conductive layer is electrically floating, and
wherein the other of the first conductive layer and the second conductive layer is a wiring.

18. The light-emitting device according to claim 17,
wherein the wiring is any one of a gate wiring, a capacitor wiring, a signal line, a power supply line, and an erase line.

19. The light-emitting device according to claim 16,
wherein the first conductive layer and the second conductive layer are electrically floating.

20. The light-emitting device according to claim 16,
wherein the first conductive layer is in the same layer as a gate electrode of the transistor,
wherein the second conductive layer is in the same layer as source and drain electrodes of the transistor, and
wherein the third conductive layer is in the same layer as the first electrode.

* * * * *